United States Patent
Ko et al.

(10) Patent No.: US 12,460,126 B2
(45) Date of Patent: Nov. 4, 2025

(54) QUANTUM DOT, METHOD OF PREPARING THE QUANTUM DOT, COMPOSITION INCLUDING THE QUANTUM DOT, OPTICAL MEMBER INCLUDING THE QUANTUM DOT, AND ELECTRONIC APPARATUS INCLUDING THE QUANTUM DOT

(71) Applicants: Samsung Display Co., Ltd., Yongin-si (KR); Hannam University Institute for Industry-Academia Cooperation, Daejeon (KR)

(72) Inventors: Yunhyuk Ko, Yongin-si (KR); Changhee Lee, Yongin-si (KR); Prem Prabhakaran, Jeongeup-si (KR); Dongryeol Whang, Daejeon (KR); Gyeongju Kim, Jeongeup-si (KR); Kwangsup Lee, Daejeon (KR)

(73) Assignees: Samsung Display Co., Ltd., Yongin-si (KR); Hannam University Institute for Industry—Academia Cooperation, Daejeon (KR)

( * ) Notice: Subject to any disclaimer, the term of this patent is extended or adjusted under 35 U.S.C. 154(b) by 542 days.

(21) Appl. No.: 17/807,693

(22) Filed: Jun. 17, 2022

(65) Prior Publication Data
US 2023/0011105 A1    Jan. 12, 2023

(30) Foreign Application Priority Data
Jun. 21, 2021    (KR) .................... 10-2021-0080440

(51) Int. Cl.
| | | |
|---|---|---|
| C09K 11/02 | (2006.01) | |
| B82Y 20/00 | (2011.01) | |
| B82Y 40/00 | (2011.01) | |
| C09K 11/88 | (2006.01) | |
| H10H 20/851 | (2025.01) | |
| H10K 50/115 | (2023.01) | |

(52) U.S. Cl.
CPC .......... *C09K 11/025* (2013.01); *C09K 11/883* (2013.01); *H10H 20/8512* (2025.01); *B82Y 20/00* (2013.01); *B82Y 40/00* (2013.01); *H10K 50/115* (2023.02)

(58) Field of Classification Search
CPC .. C09K 11/025; C09K 11/883; H10K 50/115; H01L 33/502
See application file for complete search history.

(56) References Cited

U.S. PATENT DOCUMENTS

| | | | | |
|---|---|---|---|---|
| 2014/0275598 | A1* | 9/2014 | Freeman ................ | C08G 77/26 556/439 |
| 2018/0215695 | A1* | 8/2018 | Chen .................... | H10K 50/115 |
| 2020/0067006 | A1* | 2/2020 | Ippen .................... | H10K 50/15 |
| 2020/0075877 | A1* | 3/2020 | Yu ........................ | H10K 50/115 |
| 2021/0108137 | A1 | 4/2021 | Ding et al. | |
| 2021/0183999 | A1 | 6/2021 | Kwon et al. | |
| 2022/0162500 | A1* | 5/2022 | Wang .................... | H10K 85/00 |
| 2022/0310953 | A1* | 9/2022 | Li ......................... | C09K 11/025 |

FOREIGN PATENT DOCUMENTS

| | | | |
|---|---|---|---|
| CN | 108842175 | A | 11/2018 |
| CN | 110615466 | * | 12/2019 |
| JP | 2004-315661 | * | 11/2004 |
| JP | 2021-38307 | A | 3/2021 |
| KR | 10-1440542 | B1 | 1/2010 |
| KR | 10-2013-0047943 | A | 5/2013 |
| KR | 2015-0052789 | * | 5/2015 |
| KR | 10-1687019 | B1 | 12/2016 |
| KR | 10-1993922 | * | 6/2019 |

OTHER PUBLICATIONS

Chiba, Takayuki et al., "Blue Perovskite Nanocrystal Light-Emitting Devices via the Ligand Exchange with Adamantane Diamine", Adv. Optical Mater. (2020), 2000289 (7 pages).
García-Berríos, Edgardo et al., "Composites of carboxylatecapped TiO2 nanoparticles and carbon black as chemiresistive vapor sensors", Sensors and Actuators B. Chemical (2011), 158(1), 17-22.
Krommenhoek, Peter J. et al., "Bulky Adamantanethiolate and Cyclohexanethiolate Ligands Favor Smaller Gold Nanoparticles with Altered Discrete Sizes", ACS Nano (2012), 6(6) 4903-4911 (9 pages).
Morris, Tobias et al., "Steric effects of carboxylic capping ligands on the growth of the CdSe quantum dots", J Colloids and Surfaces A: Physicochem. Eng. Aspects 443 (2014) 439-449 (11 pages).
Palmstrom, Axel F. et al., "Atomic layer deposition in nanostructured photovoltaics: tuning optical, electronic and surface properties", The Royal Society of Chemistry, Nanoscale (2015), 7(29), 12266-12283 (18 pages); DOI: 10.1039/c5nr02080h.
Ruedas-Rama, Maria Jose et al., "Azamacrocycle Activated Quantum Dot for Zinc Ion Detection", Analytical Chemistry (2008), 80(21), 8260-8268 (9 pages).

* cited by examiner

*Primary Examiner* — C Melissa Koslow
(74) *Attorney, Agent, or Firm* — Womble Bond Dickinson (US) LLP

(57) ABSTRACT

A quantum dot, a method of manufacturing the quantum dot, a composition including the quantum dot, an optical member including the quantum dot, and an electronic apparatus including the quantum dot are disclosed. The quantum dot includes: a nanomaterial; and a first ligand arranged on a surface of the nanomaterial, wherein the nanomaterial includes a core and a shell that covers at least a part of the core, wherein the first ligand includes a condensed polycyclic group in which two or more rings are condensed.

18 Claims, 3 Drawing Sheets

QUANTUM DOT, METHOD OF PREPARING THE QUANTUM DOT, COMPOSITION INCLUDING THE QUANTUM DOT, OPTICAL MEMBER INCLUDING THE QUANTUM DOT, AND ELECTRONIC APPARATUS INCLUDING THE QUANTUM DOT

CROSS-REFERENCE TO RELATED APPLICATION

This application claims priority to and the benefit of Korean Patent Application No. 10-2021-0080440, filed on Jun. 21, 2021, in the Korean Intellectual Property Office, the entire content of which is hereby incorporated by reference.

BACKGROUND

1. Field

One or more embodiments of the present disclosure relate to a quantum dot, a method of preparing the quantum dot, a composition including the quantum dot, an optical member including the quantum dot, and an electronic apparatus including the quantum dot.

2. Description of the Related Art

As a material that performs various optical functions (for example, a photo-conversion function, a light-emitting function, etc.) in an optical member and various electronic apparatuses, quantum dots may be used. Quantum dots are nano-sized semiconductor nanocrystals exhibiting a quantum confinement effect and may have different energy band gaps by adjusting the size and composition of the nanocrystals, and thus may emit light of various emission wavelengths.

An optical member including such quantum dots may have the form of a thin film, for example, a thin film patterned for each subpixel. Such an optical member may be used as a color conversion member of an apparatus including various light sources.

However, quantum dots may be used for a variety of applications in various electronic apparatuses. For example, quantum dots may be used as an emitter (e.g., a light emitting material). For example, quantum dots may act as emitters by being included in an emission layer in a light-emitting device including a pair of electrodes and the emission layer.

To implement a high-quality optical member and electronic apparatus, there is a need or desire for the development of quantum dots emitting blue light having a maximum emission wavelength of 490 nm or less, having excellent luminescence quantum efficiency (PLQY), and not including cadmium, which is a toxic element.

SUMMARY

One or more aspects of embodiments of the present disclosure are directed toward a quantum dot, a method of preparing the quantum dot, a composition including the quantum dot, an optical member including the quantum dot, and an electronic apparatus including the quantum dot.

Additional aspects will be set forth in part in the description, which follows and, in part, will be apparent from the description, or may be learned by practice of the presented embodiments of the disclosure.

According to one or more embodiments, a quantum dot includes:
a nanomaterial and a first ligand on a surface of the nanomaterial, wherein
the nanomaterial includes a core and a shell that covers at least part of the core, and
the first ligand includes a condensed polycyclic group in which two or more rings are condensed.

According to one or more embodiments, a method of manufacturing a quantum dot includes:
mixing a precursor of the nanomaterial with a precursor of the first ligand, or
exchanging a second ligand of the nanomaterial including the second ligand with the first ligand, wherein
the second ligand is different from the first ligand.

According to one or more embodiments, a composition includes the quantum dot and a solvent.

According to one or more embodiments, an optical member includes the quantum dot.

According to one or more embodiments, an electronic apparatus includes the quantum dot.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
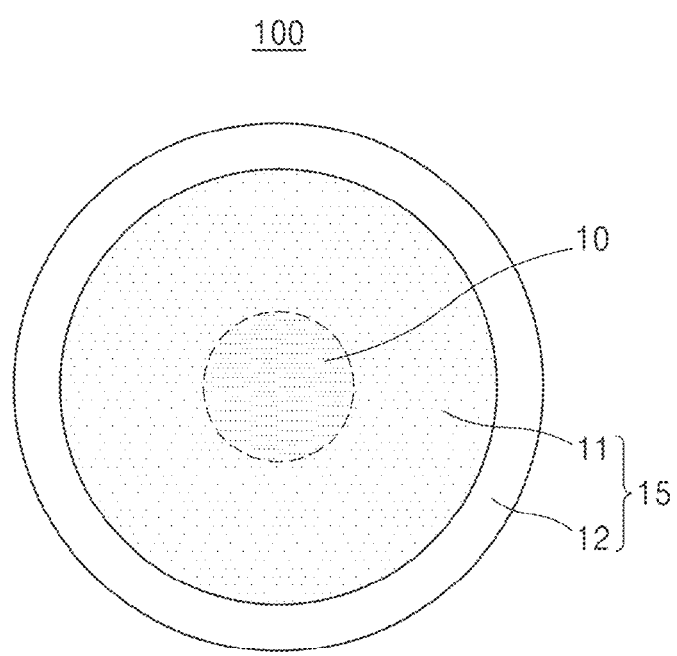
FIG. 1 is a schematic cross-sectional view of a nanomaterial according to one or more embodiments.

Reference will now be made in more detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. As used herein, expressions such as "at least one of", "one of", and "selected from", when preceding a list of elements, modify the entire list of elements and do not modify the individual elements of the list. For example, throughout the disclosure, the expression "at least one of a, b or c" may indicate only a, only b, only c, both a and b, both a and c, both b and c, all of a, b, and c, or variations thereof. Further, the use of "may" when describing embodiments of the present disclosure refers to "one or more embodiments of the present disclosure".

Because the disclosure may have diverse modified embodiments, embodiments are illustrated in the drawings and are described in the detailed description. Effects and characteristics of the disclosure, and a method of accomplishing these will be apparent when referring to embodiments described with reference to the drawings. The disclosure may, however, be embodied in many different forms and should not be construed as limited to the embodiments set forth herein.

It will be understood that although the terms "first," "second," etc. used herein may be used herein to describe various components, these components should not be limited by these terms. These components are only used to distinguish one component from another.

An expression used in the singular encompasses the expression of the plural, unless it has a clearly different meaning in the context.

In the present specification, it is to be understood that the terms such as "including," "having," and "comprising" are intended to indicate the existence of the features or components disclosed in the specification, and are not intended to preclude the possibility that one or more other features or components may exist or may be added. For example, unless otherwise limited, terms such as "including" or "having" may refer to either consisting of features or components described in the specification only or further including other components.

As used herein, the terms "use," "using," and "used" may be considered synonymous with the terms "utilize," "utilizing," and "utilized," respectively.

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The term "Group II" used herein may include a Group IIA element and a Group IIB element on the IUPAC periodic table, and the Group II element may include, for example, magnesium (Mg), calcium (Ca), zinc (Zn), cadmium (Cd), and mercury (Hg).

The term "Group III" used herein may include a Group IIIA element and a Group IIIB element on the IUPAC periodic table, and the Group III element may include, for example, aluminum (Al), gallium (Ga), indium (In), and thallium (Tl).

The term "Group V" used herein may include a Group VA element and a Group VB element on the IUPAC periodic table, and the Group V element may include, for example, nitrogen (N), phosphorus (P), arsenic (As), and antimony (Sb).

The term "Group VI" used herein may include a Group VIA element and a Group VIB element on the IUPAC periodic table, and the Group VI element may include, for example, sulfur (S), selenium (Se), and tellurium (Te).

Quantum Dot

Hereinafter, a quantum dot and a method of manufacturing the quantum dot according to one or more embodiments will be described with reference to FIG. 1.

In one or more embodiments, a quantum dot may include: a nanomaterial 100; and a first ligand arranged on a surface of the nanomaterial 100.

Nanomaterial 100

The nanomaterial 100 may include: a core 10; and a shell 15 that covers at least part of the core 10.

The core 10 may include a Group II-VI semiconductor compound, a Group III-V semiconductor compound, or any combination thereof.

In one or more embodiments, the core may include binary compounds such as CdS, CdSe, CdTe, ZnS, ZnSe, ZnTe, ZnO, HgS, HgSe, HgTe, MgSe, MgS, GaN, GaP, GaAs, GaSb, AlN, AlP, AlAs, AlSb, InN, InP, InAs, and/or InSb; ternary compounds such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, GaNP, GaNAs, GaNSb, GaPAs, GaPSb, AlNP, AlNAs, AlNSb, AlPAs, AlPSb, InGaP, InNP, InAlP, InNAs, InNSb, InPAs, and/or InPSb; quaternary compounds such as CdZnSeS, CdZnSeTe, CdZnSTe, CdHgSeS, CdHgSeTe, CdHgSTe, HgZnSeS, HgZnSeTe, HgZnSTe, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb; or any combination thereof.

In one or more embodiments, the core may include ZnS, ZnSe, ZnTe, ZnO, HgS, HgSe, HgTe, GaN, GaP, GaAs, ZnSeS, ZnSeTe, ZnSTe, InP, InAs, InZnP, InGaP, InGaN, or any combination thereof.

The shell 15 may cover part of the core 10 or all of the core 10.

The shell 15 may be formed on the surface of the core 10, and may act as a protective layer for preventing or reducing chemical degeneration of the core 10 and maintaining semiconductor characteristics and/or may also act as a charging layer for imparting electrophoretic characteristics to the nanomaterial 100.

In one or more embodiments, the shell 15 may include ZnS, ZnSe, ZnTe, ZnO, ZnSeS, ZnTeS, GaAs, GaP, GaN, $Ga_2O_3$, GaSb, HgS, HgSe, HgTe, InAs, InP, InS, InGaP, InSb, InZnP, InZnS, InGaP, InGaN, AlAs, AlP, AlSb, PbS, $TiO_2$, SrSe, or any combination thereof.

The shell 15 may include a plurality of layers or regions with different structures.

In one or more embodiments, the shell 15 may include a first shell 11 that covers at least part of the core 10 and a second shell 12 that covers at least part of the first shell 11.

When the shell includes the first shell 11 and the second shell 12, the first shell 11 may include ZnSe, and the second shell 12 may include ZnS.

In one or more embodiments, the shell 15 may include a first shell 11 that covers at least part of the core 10 and a second shell 12 that covers at least part of the first shell 11, and in some embodiments, may include a third shell that covers at least part of the second shell 12.

When the shell includes the first shell 11, the second shell 12, and the third shell, the first shell 11 may include ZnSe, the second shell 12 may include ZnSeS, and the third shell may include ZnS.

In one or more embodiments, the nanomaterial 100 may further contain suitable compounds other than the compounds described above.

For example, the nanomaterial 100 may further include a Group II-VI compound, a Group III-VI compound, a Group III-V compound, a Group IV-VI compound, a Group IV element, a Group IV compound, a Group compound, or a combination thereof.

The Group II-VI compound may be selected from a binary compound selected from CdS, CdSe, CdTe, ZnS, ZnSe, ZnTe, ZnO, HgS, HgSe, HgTe, MgSe, MgS, and any mixture thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; and a quaternary compound selected from CdZnSeS, CdZnSeTe, CdZnSTe, CdHgSeS, CdHgSeTe, CdHgSTe, HgZnSeS, HgZnSeTe, HgZnSTe, and any mixture thereof.

The Group III-VI compound may include: a binary compound such as $In_2S_3$ and/or $In_2Se$; a ternary compound such as $InGaS_3$ and/or $InGaSe_3$; or any combination thereof.

For example, the Group III-V compound may be selected from: a binary compound selected from GaN, GaP, GaAs, GaSb, AlN, AlP, AlAs, AlSb, InN, InP, InAs, InSb, and any mixture thereof; a ternary compound selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, and any mixture thereof; and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof. The Group III-V semiconductor compound may further include a Group II metal (for example, the compound may be InZnP, etc.).

The Group IV-VI compound may be selected from: a binary compound selected from SnS, SnSe, SnTe, PbS, PbSe, PbTe, and any mixture thereof; a ternary compound selected from SnSeS, SnSeTe, SnSTe, PbSeS, PbSeTe, PbSTe, SnPbS, SnPbSe, SnPbTe, and any mixture thereof; and a quaternary compound selected from SnPbSSe, SnPbSeTe, SnPbSTe, and any mixture thereof. The Group IV element may be selected from Si, Ge, and any mixture thereof. The Group IV compound may be a binary compound selected from SiC, SiGe, and any mixture thereof.

The Group I-III-VI semiconductor compound may include: a ternary compound such as AgInS, $AgInS_2$, CuInS, $CuInS_2$, $CuGaO_2$, $AgGaO_2$, and/or $AgAlO_2$; or any combination thereof.

The binary compound, the ternary compound, and/or the quaternary compound may exist in particles at uniform concentration, or may exist in the same particle in a state in which a concentration distribution is partially different.

In one or more embodiments, the shell 15 may include a metal oxide, a non-metal oxide, a semiconductor compound, or any combination thereof.

For example, the metal oxide and the non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; and/or a ternary compound such as $MgAl_2O_4$, $CoFe_2O_4$, $NiFe_2O_4$, and/or $CoMn_2O_4$.

In one or more embodiments, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and/or AlSb.

First Ligand

The first ligand may include a condensed polycyclic group in which two or more rings are condensed.

In one or more embodiments, the first ligand may include a condensed polycyclic group in which three rings are condensed.

In one or more embodiments, the first ligand may include a group represented by Formula 1:

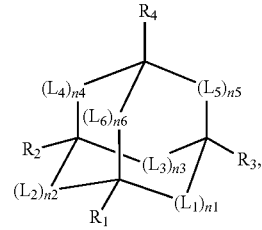

Formula 1 wherein, in Formula 1, $L_1$ may be $N(Z_{1a})$, O, S, or $C(Z_{1a})(Z_{1b})$,
$L_2$ may be $N(Z_{2a})$, O, S, or $C(Z_{2a})(Z_{2b})$,
$L_3$ may be $N(Z_{3a})$, O, S, or $C(Z_{3a})(Z_{3b})$,
$L_4$ may be $N(Z_{4a})$, O, S, or $C(Z_{4a})(Z_{4b})$,
$L_5$ may be $N(Z_{5a})$, O, S, or $C(Z_{5a})(Z_{5b})$, and
$L_6$ may be $N(Z_{6a})$, O, S, or $C(Z_{6a})(Z_{6b})$.

In one or more embodiments, $L_1$ may be $C(Z_{1a})(Z_{1b})$, $L_2$ may be $C(Z_{2a})(Z_{2b})$, $L_3$ may be $C(Z_{3a})(Z_{3b})$, $L_4$ may be $C(Z_{4a})(Z_{4b})$, $L_5$ may be $C(Z_{5a})(Z_{5b})$, and $L_6$ may be $C(Z_{6a})(Z_{6b})$, and $Z_{1a}$ to $Z_{6a}$ and $Z_{1b}$ to $Z_{6b}$ are the same as described in the present specification.

n1 to n6 in Formula 1 may each independently be an integer from 0 to 10.

In one or more embodiments, n1 to n6 may be 1.

In Formula 1, $R_1$ to $R_4$, $Z_{1a}$ to $Z_{6a}$, and $Z_{1b}$ to $Z_{6b}$ may each independently be selected from: hydrogen, deuterium, —F, —Cl, —Br, —I, a hydroxyl group, a thiol group, a cyano group, a nitro group, an amidino group, a hydrazine group, a hydrazone group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —O($Q_1$), —S($Q_1$), —B($Q_1$)($Q_2$), —C(=O)($Q_1$), —S(=O)$_2$($Q_1$), —P($Q_1$)($Q_2$), and —P(=O)($Q_1$)($Q_2$); and a conjugate base thereof.

$R_{10a}$ may be:

deuterium, —F, —Cl, —Br, —I, a hydroxyl group, a thio group, a cyano group, a nitro group, an amidino group, a hydrazine group, or a hydrazone group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each unsubstituted or substituted with deuterium, —F, —Cl, —Br, —I, a hydroxyl group, a thio group, a cyano group, a nitro group, an amidino group, a hydrazine group, a hydrazone group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —O($Q_{11}$), —S($Q_{11}$), —B($Q_{11}$)($Q_{12}$), —C(=O)($Q_{11}$), —S(=O)$_2$($Q_{11}$), —P($Q_{11}$)($Q_{12}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a thio group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —O($Q_{21}$), —S($Q_{21}$), —B($Q_{21}$)($Q_{22}$), —C(=O)($Q_{21}$), —S(=O)$_2$($Q_{21}$), —P($Q_{21}$)($Q_{22}$), —P(=O)($Q_{21}$)($Q_{22}$), or any combination thereof; or —Si($Q_{31}$)($Q_{32}$)($Q_{33}$), —N($Q_{31}$)($Q_{32}$), —O($Q_{31}$), —S($Q_{31}$), —B($Q_{31}$)($Q_{32}$), —C(=O)($Q_{31}$), —S(=O)$_2$($Q_{31}$), —P($Q_{31}$)($Q_{32}$), or —P(=O)($Q_{31}$)($Q_{32}$);

wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a thio group; an amino group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In one or more embodiments, $R_1$ to $R_4$, $Z_{1a}$ to $Z_{6a}$, and $Z_{1b}$ to $Z_{6b}$ may each independently be selected from:

hydrogen, deuterium, —F, —Cl, —Br, —I, a hydroxyl group, a thio group, a cyano group, a nitro group, an amidino group, a hydrazine group, a hydrazone group, a $C_1$-$C_{20}$ alkyl group, a $C_1$-$C_{20}$ alkoxy group, and a $C_1$-$C_{20}$ alkylthio group;

a $C_1$-$C_{20}$ alkyl group, a $C_1$-$C_{20}$ alkoxy group, and a $C_1$-$C_{20}$ alkylthio group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a thio group, a cyano group, a nitro group, an amidino group, a hydrazine group, a hydrazone group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, —Si($Q_{31}$)($Q_{32}$)($Q_{33}$), —N($Q_{31}$)($Q_{32}$), —O($Q_{31}$), —S($Q_{31}$), —B($Q_{31}$)($Q_{32}$), —P($Q_{31}$)($Q_{32}$), —C(=O)($Q_{31}$), —S(=O)$_2$($Q_{31}$), and —P(=O)($Q_{31}$)($Q_{32}$);

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, and an azadibenzosilolyl group, each unsubstituted or substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a thio group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, $-Si(Q_{31})(Q_{32})(Q_{33})$, $-N(Q_{31})(Q_{32})$, $-O(Q_{31})$, $-S(Q_{31})$, $-B(Q_{31})(Q_{32})$, $-P(Q_{31})(Q_{32})$, $-C(=O)(Q_{31})$, $-S(=O)_2(Q_{31})$, and $-P(=O)(Q_{31})(Q_{32})$;

$-Si(Q_1)(Q_2)(Q_3)$, $-N(Q_1)(Q_2)$, $-B(Q_1)(Q_2)$, $-C(=O)(Q_1)$, $-S(=O)_2(Q_1)$, $-P(Q_1)(Q_2)(Q_3)$, and $-P(=O)(Q_1)(Q_2)$; and a conjugate base thereof, wherein $Q_1$ to $Q_3$ and $Q_{31}$ to $Q_{33}$ may each independently be selected from:

hydrogen, deuterium, $-CH_3$, $-CD_3$, $-CD_2H$, $-CDH_2$, $-CH_2CH_3$, $-CH_2CD_3$, $-CH_2CD_2H$, $-CH_2CDH_2$, $-CHDCH_3$, $-CHDCD_2H$, $-CHDCDH_2$, $-CHDCD_3$, $-CD_2CD_3$, $-CD_2CD_2H$, and $-CD_2CDH_2$;

$-F$, $-Cl$, $-Br$, $-I$, a hydroxyl group, a thio group, an amino group, and a $C_1$-$C_{10}$ alkyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, and a triazinyl group, each unsubstituted or substituted with at least one selected from deuterium, a $C_1$-$C_{10}$ alkyl group, a phenyl group, a biphenyl group, a pyridinyl group, a pyrimidinyl group, a pyridazinyl group, a pyrazinyl group, and a triazinyl group.

In one or more embodiments, $R_1$ to $R_4$, $Z_{1a}$ to $Z_{6a}$, and $Z_{1b}$ to $Z_{6b}$ may each independently be selected from:

hydrogen, deuterium, $-F$, $-Cl$, $-Br$, $-I$, a hydroxyl group, a thio group, a $C_1$-$C_{20}$ alkyl group, a $C_1$-$C_{20}$ alkoxy group, and a $C_1$-$C_{20}$ alkylthio group;

a $C_1$-$C_{20}$ alkyl group, a $C_1$-$C_{20}$ alkoxy group, and a $C_1$-$C_{20}$ alkylthio group, each substituted with at least one selected from deuterium, $-F$, $-Cl$, $-Br$, $-I$, $-CD_3$, $-CD_2H$, $-CDH_2$, $-CF_3$, $-CF_2H$, $-CFH_2$, a $C_1$-$C_{10}$ alkyl group, a cyclopentyl group, a cyclohexyl group, a cycloheptyl group, a cyclooctyl group, $-N(Q_{31})(Q_{32})$, $-O(Q_{31})$, $-S(Q_{31})$, $-P(Q_{31})(Q_{32})$, $-C(=O)(Q_{31})$, $-S(=O)_2(Q_3i)$, and $-P(=O)(Q_{31})(Q_{32})$;

a cyclopentyl group, a cyclohexyl group, a cycloheptyl group, a cyclooctyl group, a phenyl group, a biphenyl group, a $C_1$-$C_{10}$ alkylphenyl group, and a naphthyl group, each unsubstituted or substituted with at least one selected from deuterium, $-F$, $-Cl$, $-Br$, $-I$, $-CD_3$, $-CD_2H$, $-CDH_2$, $-CF_3$, $-CF_2H$, $-CFH_2$, a $C_1$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, $-N(Q_{31})(Q_{32})$, $-O(Q_{31})$, $-S(Q_{31})$, $-P(Q_{31})(Q_{32})$, $-C(=O)(Q_{31})$, $-S(=O)_2(Q_{31})$, and $-P(=O)(Q_{31})(Q_{32})$;

$-N(Q_1)(Q_2)$, $-S(Q_1)$, $-C(=O)(Q_1)$, $-S(=O)_2(Q_1)$, $-P(Q_1)(Q_2)$, and $-P(=O)(Q_1)(Q_2)$; and a conjugate base thereof, wherein $Q_1$, $Q_2$, $Q_{31}$, and $Q_{32}$ may each independently be selected from:

hydrogen, deuterium, $-CH_3$, $-CD_3$, $-CD_2H$, $-CDH_2$, $-CH_2CH_3$, $-CH_2CD_3$, $-CH_2CD_2H$, $-CH_2CDH_2$, $-CHDCH_3$, $-CHDCD_2H$, $-CHDCDH_2$, $-CHDCD_3$, $-CD_2CD_3$, $-CD_2CD_2H$, and $-CD_2CDH_2$; and $-F$, $-Cl$, $-Br$, $-I$, a hydroxyl group, a thio group, an amino group, and a $C_1$-$C_{10}$ alkyl group.

In one or more embodiments, $R_1$ to $R_4$ may each independently be selected from:

hydrogen, deuterium, $-F$, $-Cl$, $-Br$, $-I$, a hydroxyl group, a thio group, and a $C_1$-$C_{20}$ alkylthio group;

a $C_1$-$C_{20}$ alkyl group, a $C_1$-$C_{20}$ alkoxy group, and a $C_1$-$C_{20}$ alkylthio group, each substituted with at least one selected from deuterium, $-F$, $-Cl$, $-Br$, $-I$, $-CD_3$, $-CD_2H$, $-CDH_2$, $-CF_3$, $-CF_2H$, $-CFH_2$, a $C_1$-$C_{10}$ alkyl group, $-N(Q_{31})(Q_{32})$, $-O(Q_{31})$, $-S(Q_{31})$, $-P(Q_{31})(Q_{32})$, and $-C(=O)(Q_{31})$;

$-N(Q_1)(Q_2)$, $-C(=O)(Q_1)$, and $-P(Q_1)(Q_2)$; and a conjugate base thereof.

$R_{10a}$, $Q_1$, $Q_2$, $Q_{31}$, and $Q_{32}$ are each the same as described in the present specification.

In one or more embodiments, at least one selected from $R_1$ to $R_4$ may be selected from:

$-F$, $-Cl$, $-Br$, $-I$, a hydroxy group or a conjugate base thereof ($-O^-$), a thio group or a conjugate base thereof ($-S^-$), an amino group or a conjugate base thereof ($-NH^-$), a carboxylic acid group or a conjugate base thereof ($-COO^-$), and an acetic acid group or a conjugate base thereof ($-CH_2COO^-$); and a $C_1$-$C_{20}$ alkyl group unsubstituted or substituted with at least one selected from deuterium, $-F$, $-Cl$, $-Br$, $-I$, a hydroxy group or a conjugate base thereof ($-O^-$), a thio group or a conjugate base thereof ($-S^-$), an amino group or a conjugate base thereof ($-NH^-$), carboxylic acid group or a conjugate base thereof ($-COO^-$), and an acetic acid group or a conjugate base thereof ($-CH_2COO^-$).

In one or more embodiments, the first ligand may include 1-adamantanecarboxylic acid, 1-adamantaneacetic acid, 1-adamantanemethanol, 1-fluoroadamantane, 1-iodoadamantane, 1-bromoadamantane, 1-chloroadamantane, 1-methyladamantane, adamantan-1-amine, adamantane-1-thiol, adamantane-2-thiol, 1-adamantylmethanethiol, 2-(1-adamantly)ethanethiol, 6-(1-adamantly)hexane-1-thiol, 18-(1-adamantyl)octadecane-1-thiol, 1-adamantanemethylamine, o-(1-adamantly)hydroxylamine, 1-adamantylphosphane, adamantane-1-carbaldehyde, 1-hydroperoxyadmantane, 1-adamantanecarbonylchloride, 1,3-dibromoadamantane, 1-adamantly thiohypochlorite, 1-(disulfanyl)adamantine, 1-ethylsulfanyladamantane, adamantane-1,3-dithiol, 1-(dichloromethyl)adamantine, and/or 1-(chloromethyl)adamantine.

The quantum dot may include the nanomaterial 100 having a core-shell structure and the first ligand arranged on the surface of the nanomaterial 100, wherein the first ligand may include a condensed polycyclic group in which two or more rings are condensed.

The quantum dot may include a condensed polycyclic group, for example, an adamantane group as a ligand, and thus the size of the quantum dot may increase, the distance between adjacent quantum dots in a solvent may decrease, and the solubility with respect to the solvent may increase.

The increased hydrophobicity due to the ligand may suppress or reduce the environmental effect (e.g., the effect of an outside environment) on the quantum dot, and may improve stability of a light-emitting device including the quantum dot.

In one or more embodiments, a maximum emission wavelength of a photoluminescence (PL) spectrum may be 410 nm to 500 nm, for example, 420 nm to 490 nm, 420 nm to 480 nm, or 430 nm to 470 nm.

In one or more embodiments, a full width at half maximum (FWHM) of the PL spectrum of the nanomaterial 100 may be 50 nm or less, for example, 45 nm or less, 43 nm or less, 40 nm or less, or 38 nm or less. When the FWHM of the nanomaterial 100 satisfies the range described above, color purity and/or reproducibility may be improved. In addition, because light is emitted through the nanomaterial 100 in all directions, a wide viewing angle may be improved.

In one or more embodiments, the shape of the nanomaterial 100 is not limited as long as it is a suitable shape in the art. For example, the nanomaterial 100 may be in the form of a spherical particle, a pyramidal particle, a multi-arm particle, a cubic nanoparticle, a nanotube particle, a nanowire particle, a nanofiber particle, and/or a nanoplate particle.

In one or more embodiments, a diameter of the quantum dot may be 5 nm to 10 nm, for example, 6 nm to 9 nm, or 6.2 nm to 8 nm.

In one or more embodiments, the nanomaterial 100 may further contain suitable compounds other than the compounds described above.

For example, the nanomaterial 100 may further include a Group II-VI compound, a Group III-VI compound, a Group III-V compound, a Group IV-VI compound, a Group IV element, a Group IV compound, a Group compound, or a combination thereof.

The Group II-VI compound may be selected from: a binary compound selected from CdS, CdSe, CdTe, ZnS, ZnSe, ZnTe, ZnO, HgS, HgSe, HgTe, MgSe, MgS, and any mixture thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; and a quaternary compound selected from CdZnSeS, CdZnSeTe, CdZnSTe, CdHgSeS, CdHgSeTe, CdHgSTe, HgZnSeS, HgZnSeTe, HgZnSTe, and any mixture thereof.

The Group III-VI compound may include: a binary compound such as $In_2S_3$ and/or $In_2Se$; a ternary compound such as $InGaS_3$ and/or $InGaSe_3$; or any combination thereof.

For example, the Group III-V compound may be selected from: a binary compound selected from GaN, GaP, GaAs, GaSb, AlN, AlP, AlAs, AlSb, InN, InP, InAs, InSb, and any mixture thereof; a ternary compound selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, and any mixture thereof; and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof, but embodiments of the present disclosure are not limited thereto. The Group III-V semiconductor compound may further include a Group II metal (for example, the compound may be InZnP, etc.).

The Group IV-VI compound may be selected from: a binary compound selected from SnS, SnSe, SnTe, PbS, PbSe, PbTe, and any mixture thereof; a ternary compound selected from SnSeS, SnSeTe, SnSTe, PbSeS, PbSeTe, PbSTe, SnPbS, SnPbSe, SnPbTe, and any mixture thereof; and a quaternary compound selected from SnPbSSe, SnPbSeTe, SnPbSTe, and any mixture thereof. The Group IV element may be selected from Si, Ge, and any mixture thereof. The Group IV compound may be a binary compound selected from SiC, SiGe, and any mixture thereof.

The Group semiconductor compound may include a ternary compound, such as AgInS, $AgInS_2$, CuInS, $CuInS_2$, $CuGaO_2$, $AgGaO_2$, and/or $AgAlO_2$; or any combination thereof.

The binary compound, the ternary compound, and/or the quaternary compound may exist in particles at uniform concentration, or may exist in the same particle in a state in which a concentration distribution is partially different.

In one or more embodiments, the shell 15 may further include a metal oxide, a non-metal oxide, a semiconductor compound, or any combination thereof.

For example, the metal oxide and non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; and/or a ternary compound such as $MgAl_2O_4$, $CoFe_2O_4$, $NiFe_2O_4$, and/or $CoMn_2O_4$.

In one or more embodiments, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and/or AlSb.

Method of Manufacturing Quantum Dot

A method of manufacturing a quantum dot may include:
mixing a precursor of the nanomaterial 100 with a precursor of the first ligand, or
exchanging a second ligand of the nanomaterial 100 including the second ligand to the first ligand, wherein:
the second ligand may be different from the first ligand.

In one or more embodiments, the precursor of the nanomaterial 100 may include Zn, Hg, Ga, In, or any combination thereof.

In one or more embodiments, the precursor of the first ligand may include a group represented by Formula 1:

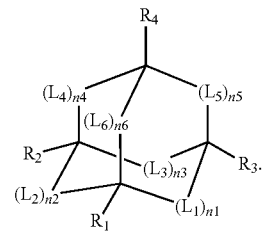

Formula 1

$L_1$ to $L_6$, n1 to n6, and $R_1$ to $R_4$ in Formula 1 are each the same as described in the present specification.

In one or more embodiments, the second ligand may be a $C_1$-$C_{60}$ alkyl group unsubstituted or substituted with at least one $R_{10a}$, or a $C_1$-$C_{60}$ alkylthio group unsubstituted or substituted with at least one $R_{10a}$.

The quantum dot may be synthesized by a wet chemical process, a metal organic chemical vapor deposition process, a molecular beam epitaxy process, or any suitable process similar thereto.

The wet chemical process is a method of mixing a precursor material with an organic solvent and then growing the quantum dot particle crystal. When the crystal grows, the organic solvent naturally acts as a dispersant coordinated on the surface of the quantum dot crystal and controls the growth of the crystal so that the growth of quantum dot particles may be controlled through a process which costs lower, and is easier than vapor deposition methods, such as metal organic chemical vapor deposition (MOCVD) or molecular beam epitaxy (MBE).

Composition

In one or more embodiments, provided is a composition including the quantum dot and a solvent.

Any suitable solvent that may dissolve the quantum dot may be utilized as the solvent.

For example, the solvent in the composition may be: alkylene glycol alkyl ethers (such as ethylene glycol monomethyl ether, ethylene glycol monoethyl ether, ethylene glycol monopropyl ether, ethylene glycol monobutyl ether, propylene glycol monomethyl ether, and/or propylene glycol methylethyl ether); diethylene glycol dialkylethers (such as diethylene glycol dimethyl ether, diethylene glycol diethyl ether, diethylene glycol dipropyl ether, and/or diethylene glycol dibutyl ether); alkylene glycol alkyl ether acetates (such as methyl cellosolve acetate, ethyl cellosolve acetate, propylene glycol monomethyl ether acetate, propylene glycol monoethyl ether acetate, and/or propylene glycol monopropyl ether acetate); alkoxy alkyl acetates (such as methoxy butyl acetate and/or methoxypentyl acetate); aromatic hydrocarbons (such as benzene, toluene, xylene, and/or mesitylene); ketones (such as methylethyl ketone, acetone, methylamyl ketone, methyl isobutyl ketone, and/or cyclohexanone); alcohols (such as ethanol, propanol, butanol, hexanol, cyclohexanol, ethyleneglycol, and/or glycerin); esters (such as 3-ethoxy ethyl propionate ester, 3-methoxy methyl propionate ester, and/or 3-phenyl-ethyl propionate ester); annular esters (such as γ-butyrolactone); methoxybenzene (anisole); or any combination thereof.

Optical Member

The quantum dot may be used in various suitable optical members. In one or more embodiments, provided is an optical member including the quantum dot.

In one or more embodiments, the optical member may be a light control member.

In one or more embodiments, the optical member may be a color filter, a color conversion member, a capping layer, a light extraction efficiency improvement layer, a selective light absorbing layer, and/or a polarizing layer.

Apparatus

The quantum dot may be used in various suitable electronic apparatuses. In one or more embodiments, an electronic apparatus including the quantum dot is provided.

In one or more embodiments, the electronic apparatus may include: a light source; and a color conversion member located on a path of light emitted from the light source.

Figure 2:
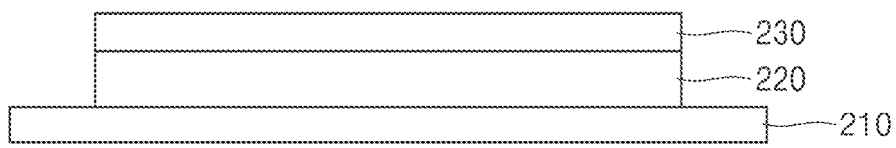
FIG. 2 is a schematic view of an electronic apparatus according to one or more embodiments.

FIG. 2 is a diagram briefly illustrating the structure of the electronic apparatus 200A according to one or more embodiments. The electronic apparatus 200A of FIG. 2 may include: a substrate 210; a light source 220 located on the substrate 210; and a color conversion member 230 located on the light source 220.

For example, the light source 220 may be a back light unit (BLU) used in the liquid crystal display (LCD), a fluorescent lamp, a light-emitting device, an organic light-emitting device, a quantum dot light-emitting device (QLED), or any combination thereof. The color conversion member 230 may be located on at least one traveling direction of light emitted from the light source 220.

At least one region of the color conversion member 230 in the electronic apparatus 200A may include the quantum dot, and the region may absorb light emitted from the light source 220 to emit blue light with a maximum emission wavelength of about 510 nm to 540 nm.

Here, the color conversion member 230, being located on at least one traveling direction of light emitted from the light source 220, does not exclude the possibility of other elements being further included between the color conversion member 230 and the light source 220.

For example, a polarizer, a liquid crystal layer, a light-guiding plate, a diffusion plate, a prism sheet, a microlens sheet, a luminance enhancement sheet, a reflective film, a color filter, or any combination thereof may further be located between the light source 220 and the color conversion member 230.

As another example, a polarizer, a liquid crystal layer, a light-guiding plate, a diffusion plate, a prism sheet, a microlens sheet, a luminance enhancement sheet, a reflective film, a color filter, or any combination thereof may further be located on the color conversion member 230.

The electronic apparatus 200A of FIG. 2 is an example of an apparatus according to one or more embodiments, and the apparatus may have various suitable forms, and may further include various suitable components.

In one or more embodiments, the electronic apparatus may have a structure wherein a light source, a light-guiding plate, a color conversion member, a first polarizer, a liquid crystal layer, a color filter, and a second polarizer are sequentially stacked.

In one or more embodiments, the electronic apparatus may have a structure wherein a light source, a light-guiding plate, a first polarizer, a liquid crystal layer, a second polarizer, and a color conversion member are sequentially stacked.

In the embodiments, the color filter may include pigments and/or dyes. In the embodiments, any one of the first polarizer and the second polarizer may be a vertical polarizer, and the other one may be a horizontal polarizer.

The quantum dot according to the present specification may be used as an emitter. Therefore, in one or more embodiments, an electronic apparatus including: a first electrode; a second electrode facing the first electrode; an emission layer between the first electrode and the second electrode, wherein the quantum dot is included in the light-emitting device (for example, in the emission layer of the light-emitting device). The light-emitting device may include a hole transport region located between the first electrode and the emission layer, an electron transport region located between the emission layer and the second electrode, or any combination thereof.

Figure 3:
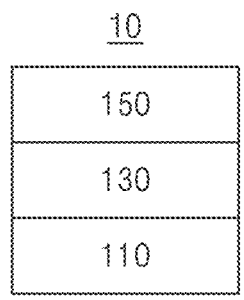
FIG. 3 is a schematic view of an electronic apparatus according to one or more embodiments.

Description of FIG. 3

FIG. 3 is a schematic cross-sectional view of a light-emitting device 10 according to one or more embodiments of the present disclosure. The light-emitting device 10 includes a first electrode 110, an interlayer 130, and a second electrode 150.

Hereinafter, the structure of the light-emitting device 10 according to one or more embodiments and a method of manufacturing the light-emitting device 10 will be described with reference to FIG. 3.

First Electrode 110

In FIG. 3, a substrate may be additionally located under the first electrode 110 or above the second electrode 150. As the substrate, a glass substrate and/or a plastic substrate may be used. In one or more embodiments, the substrate may be a flexible substrate, and may include plastics with excellent (or suitable) heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide (SnO$_2$), zinc oxide (ZnO), or any combination thereof. In one or more embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layered structure including (e.g., consisting of) a single layer or a multi-layered structure including a plurality of layers. For example, the first electrode 110 may have a three-layered structure of ITO/Ag/ITO.

Interlayer 130

The interlayer 130 may be located on the first electrode 110. The interlayer 130 may include an emission layer.

The interlayer 130 may further include a hole transport region located between the first electrode 110 and the emission layer, and an electron transport region located between the emission layer and the second electrode 150.

The interlayer 130 may further include, in addition to various suitable organic materials, a metal-containing compound such as an organometallic compound, an inorganic material such as quantum dots, and/or the like.

In one or more embodiments, the interlayer 130 may include, i) two or more emitting units sequentially stacked between the first electrode 110 and the second electrode 150, and ii) a charge generation layer located between the two or more emitting units. When the interlayer 130 includes emitting units and a charge generation layer as described above, the light-emitting device 10 may be a tandem light-emitting device.

Hole Transport Region in Interlayer 130

The hole transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, the layers of each structure being stacked sequentially from the first electrode 110.

The hole transport region may include a compound represented by Formula 201, a compound represented by Formula 202, or any combination thereof:

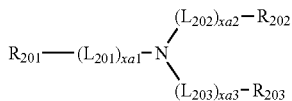

Formula 201

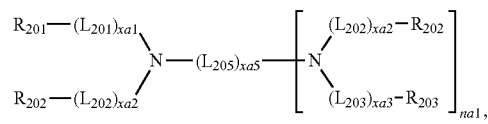

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, Formulae 201 and 202 may each independently include at least one selected from groups represented by Formulae CY201 to CY217:

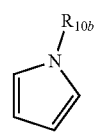

CY201

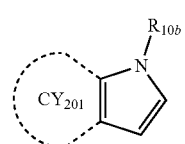

CY202

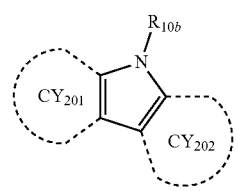

CY203

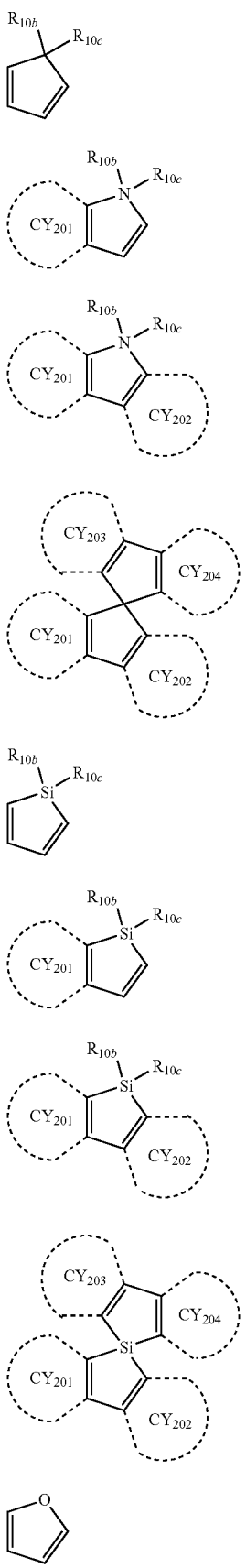
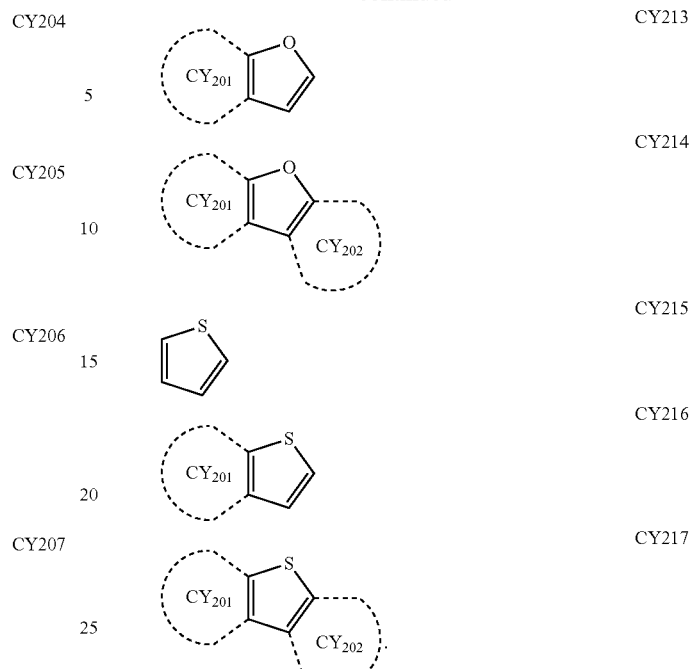

In Formulae CY201 to CY217, $R_{10b}$ and $R_{10c}$ may each be the same as described with respect to $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described above.

In one or more embodiments, ring CY201 to ring CY204 in Formulae CY201 to CY217 may each independently be a benzene group, a naphthalene group, a phenanthrene group, or an anthracene group.

In one or more embodiments, Formulae 201 and 202 may each independently include at least one selected from groups represented by Formulae CY201 to CY203.

In one or more embodiments, Formula 201 may include at least one selected from the groups represented by Formulae CY201 to CY203 and at least one selected from the groups represented by Formulae CY204 to CY217.

In one or more embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include a group represented by one of Formulae CY201 to CY203.

In one or more embodiments, each of Formulae 201 and 202 may not include a group represented by one of Formulae CY201 to CY203, and may include at least one selected from the groups represented by Formulae CY204 to CY217.

In one or more embodiments, each of Formulae 201 and 202 may not include a group represented by one of Formulae CY201 to CY217.

In one or more embodiments, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4''-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:
HT1
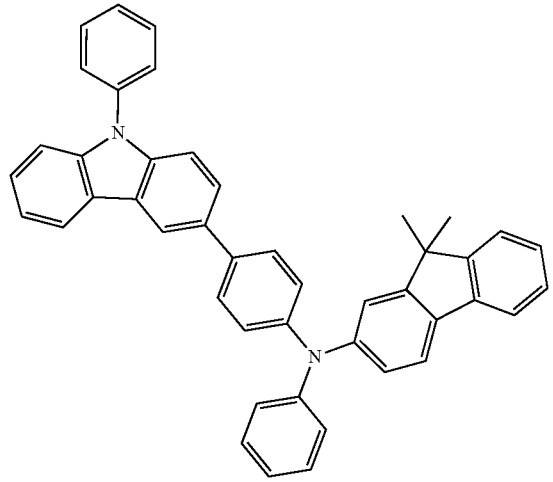
HT2
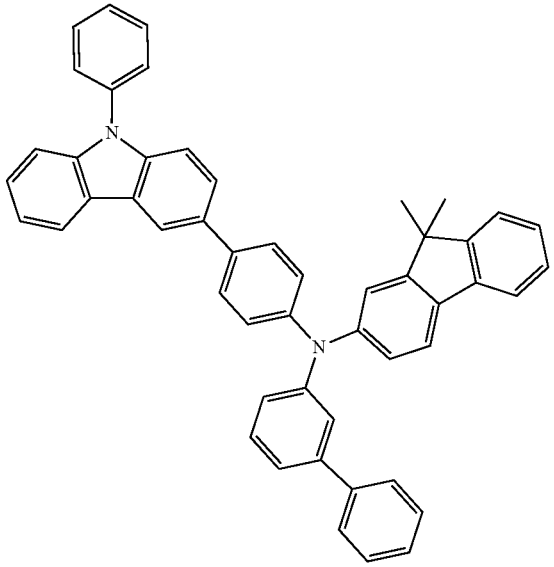
HT3
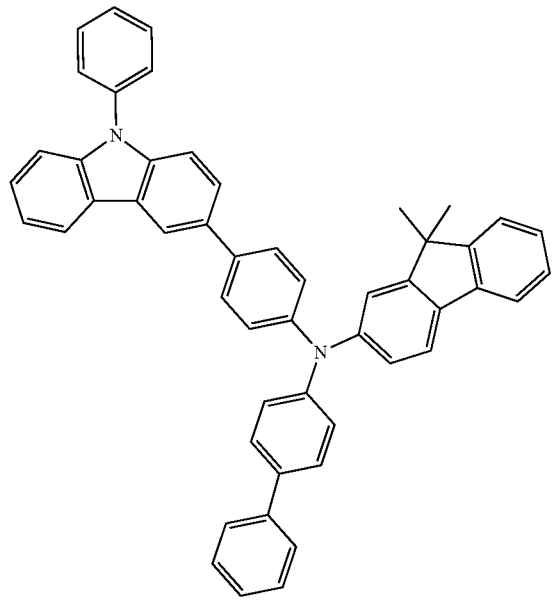
HT4
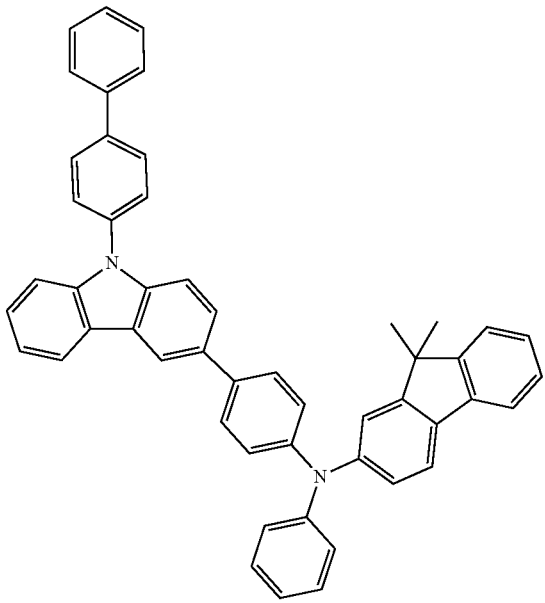

HT5
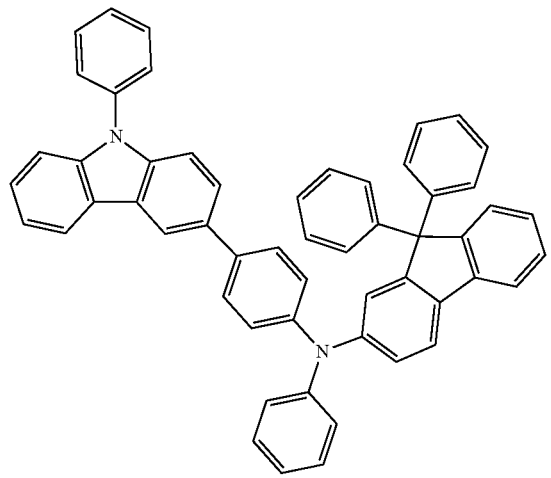
HT6
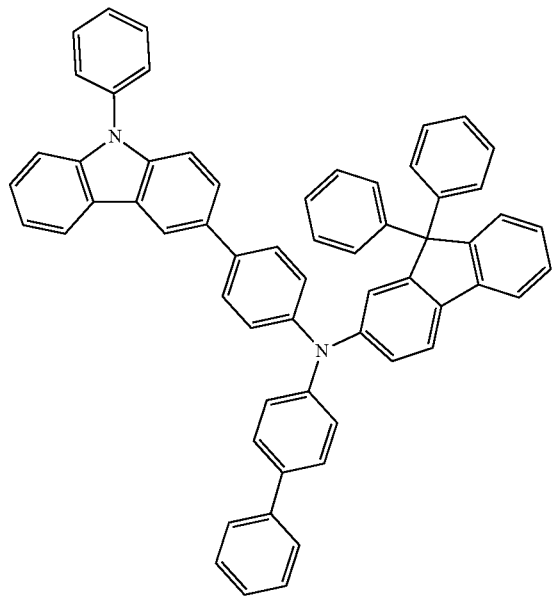
HT7
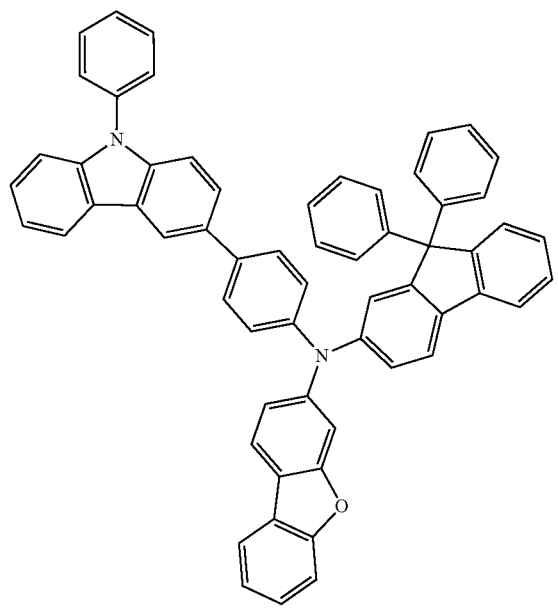
HT8
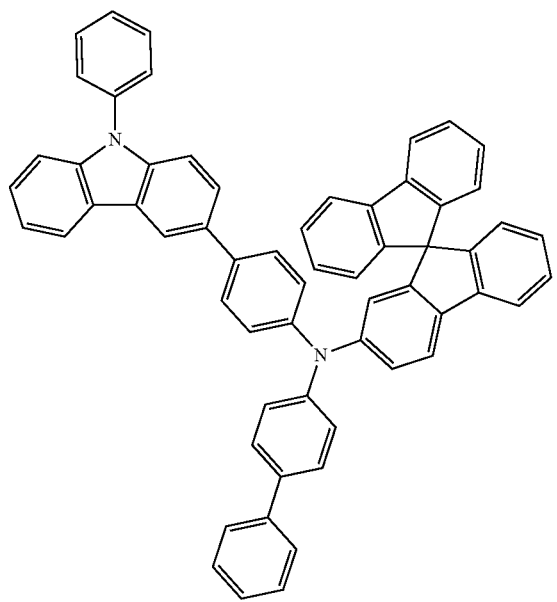

-continued
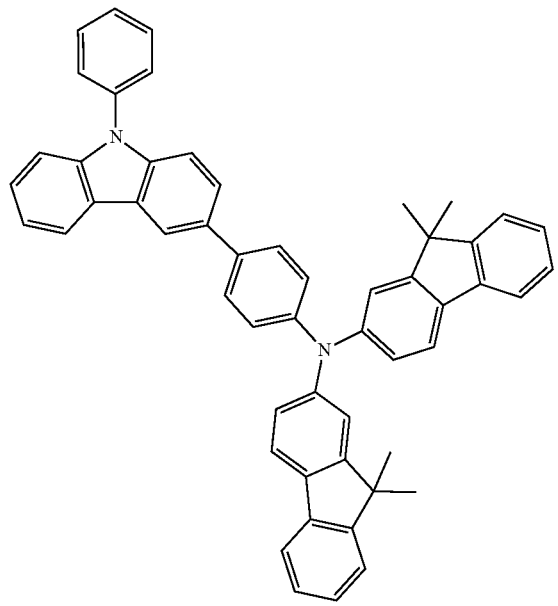
HT9
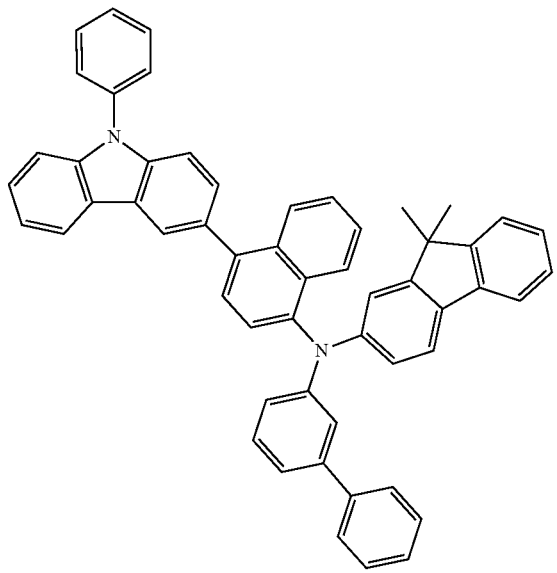
HT10
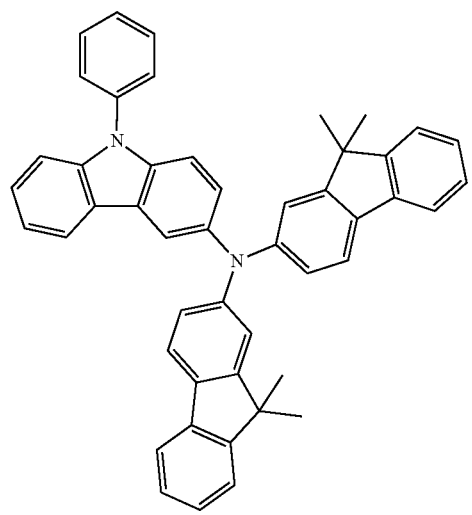
HT11
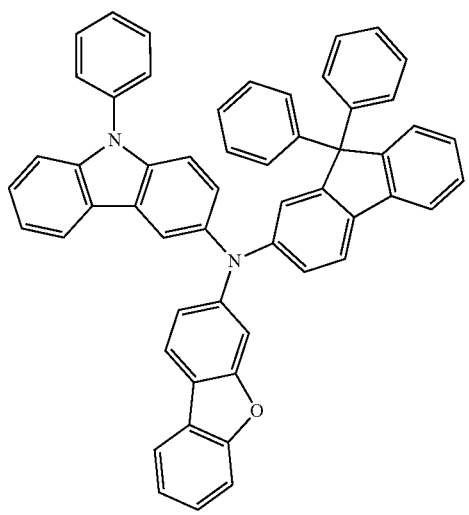
HT12

HT13
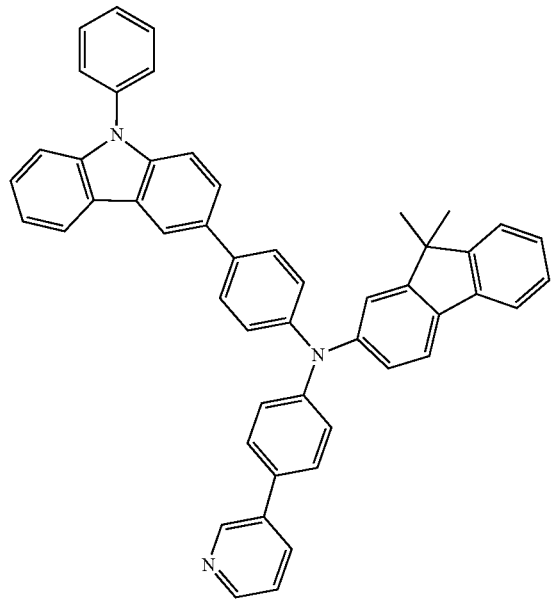
HT14
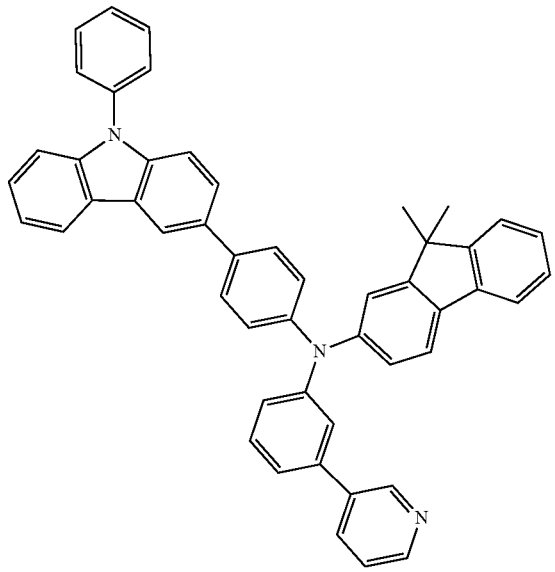
HT15
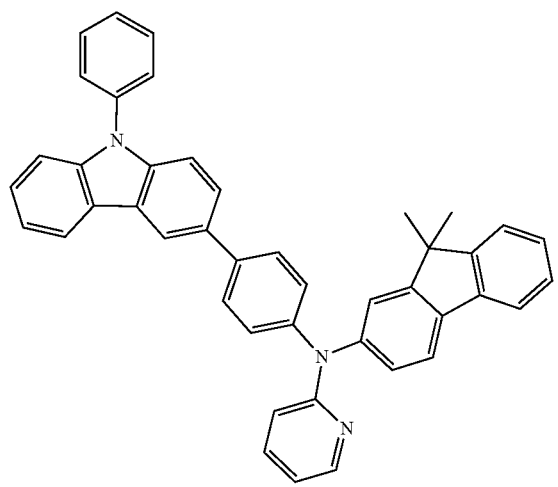
HT16
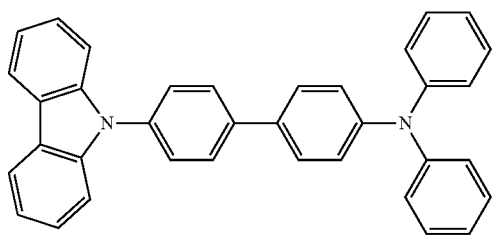
HT17
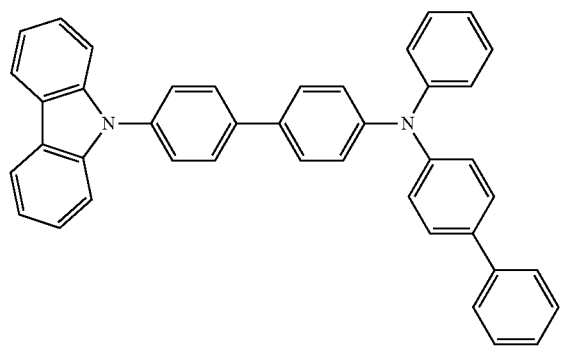
HT18
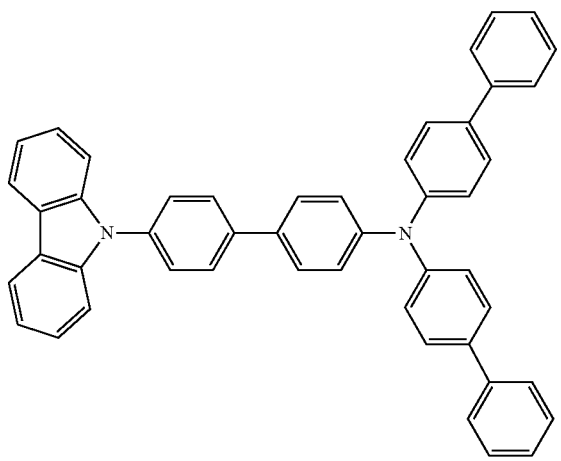

-continued
HT19
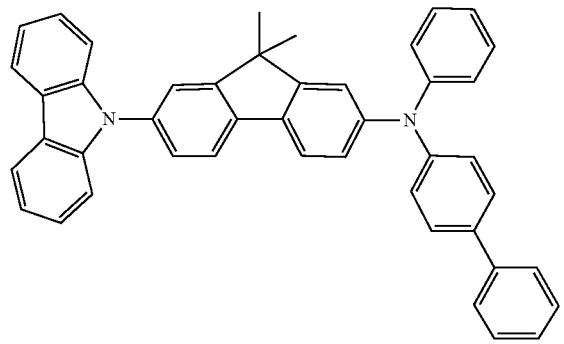
HT20
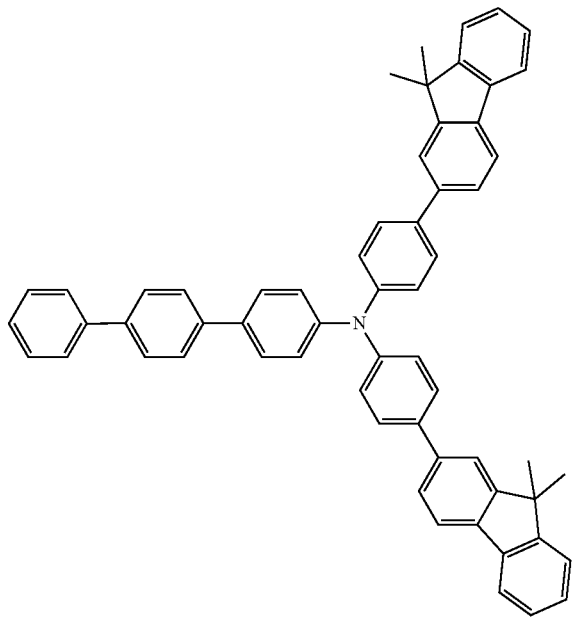
HT21
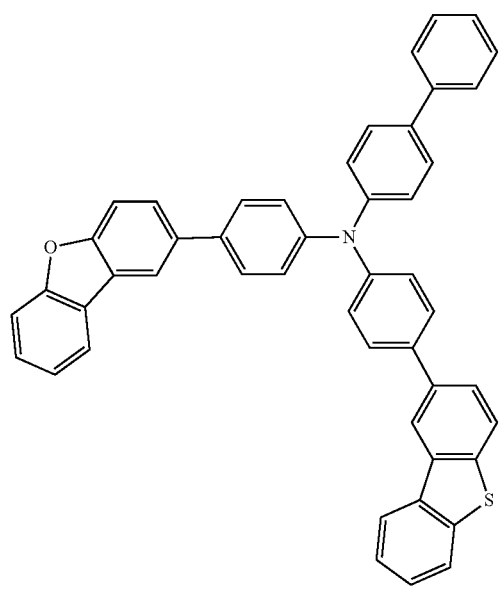
HT22
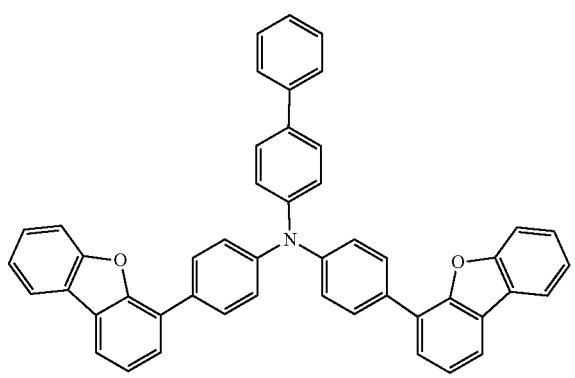

HT23
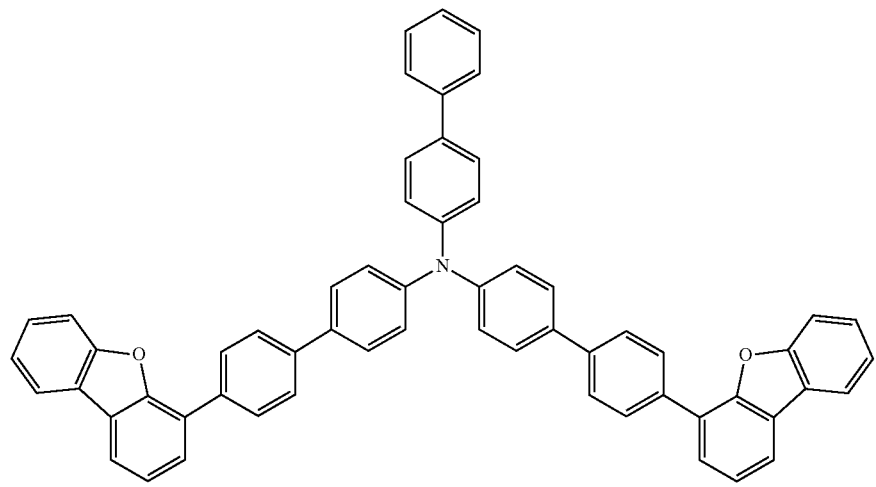
HT24
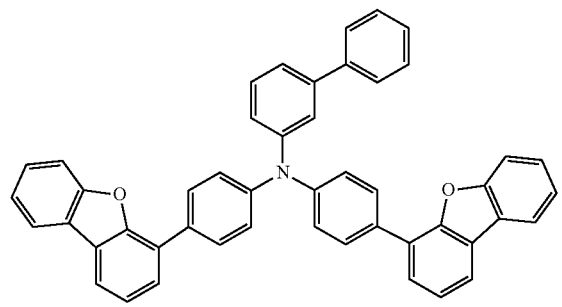
HT25 HT26
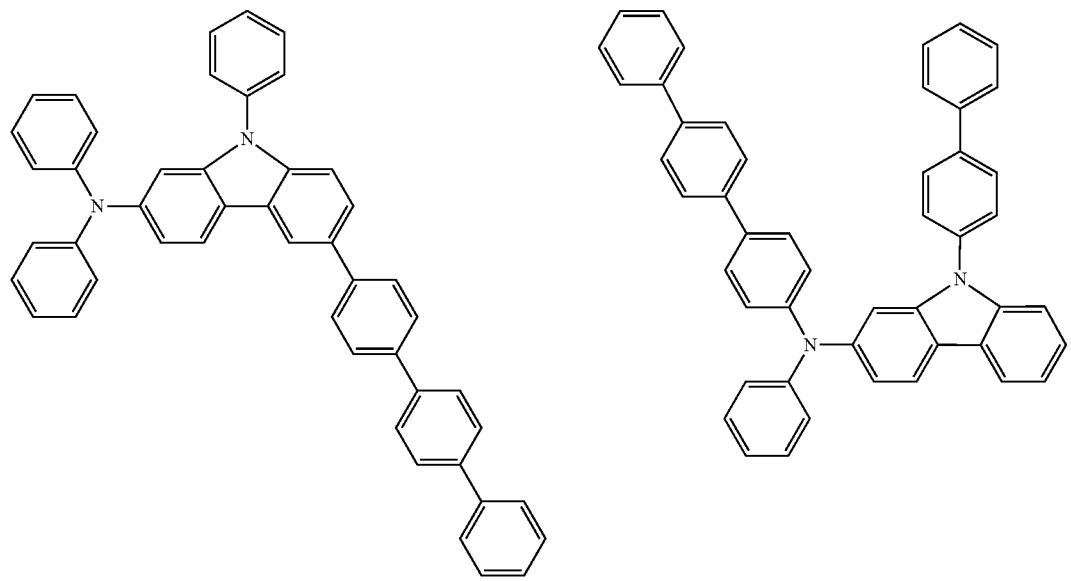

-continued
HT27
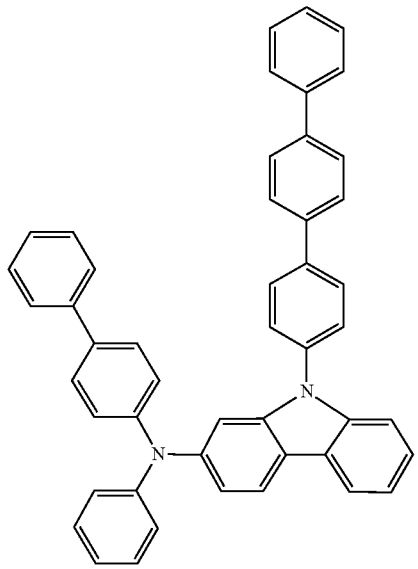
HT28
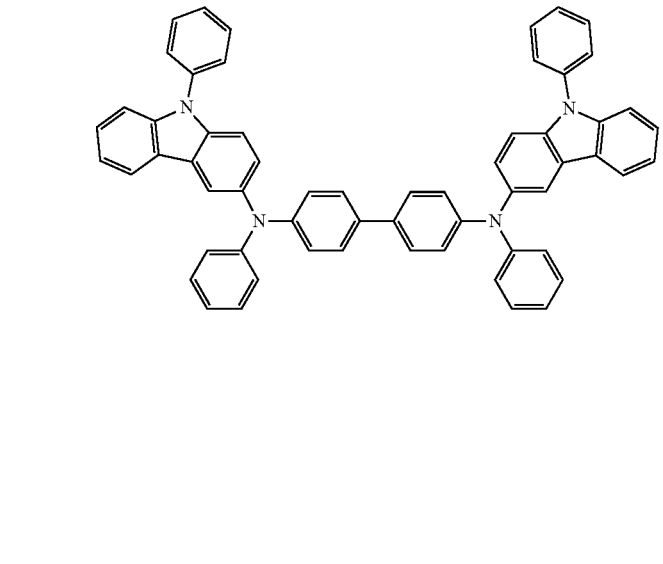

-continued
HT33
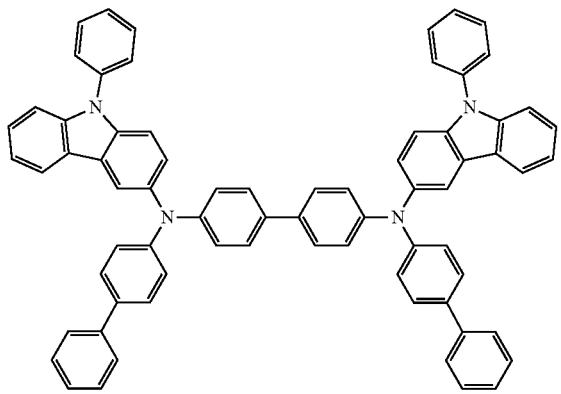
HT34
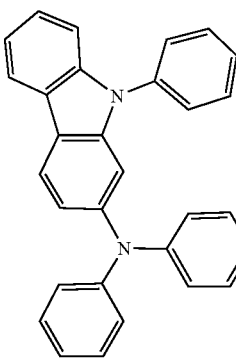
HT35
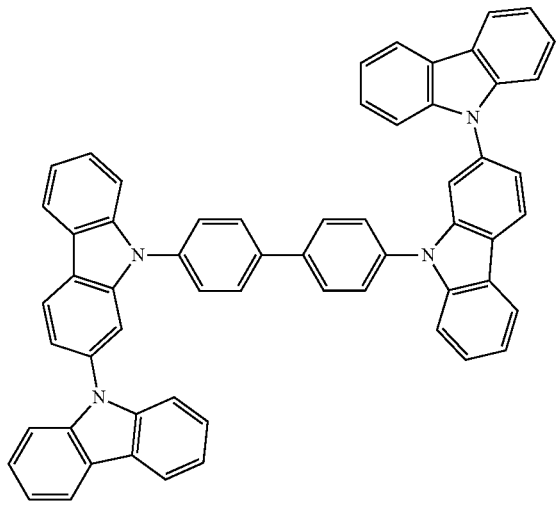
HT36
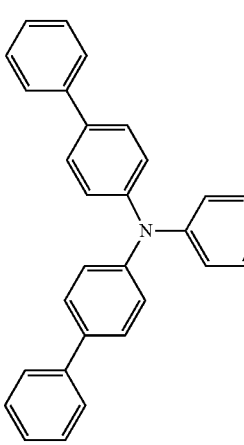
HT37
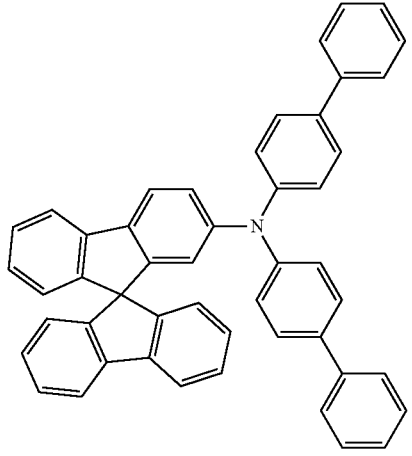
HT38
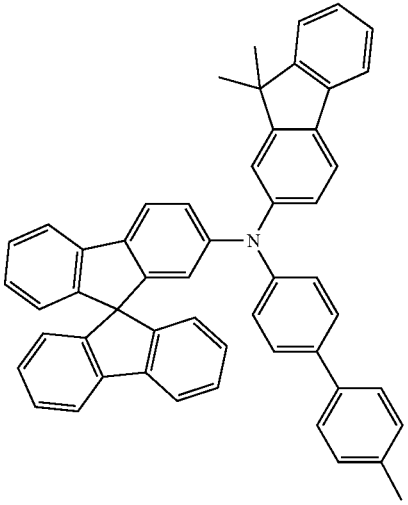

-continued
HT39
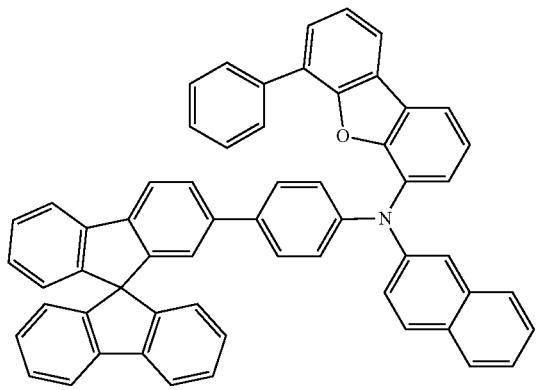
HT40
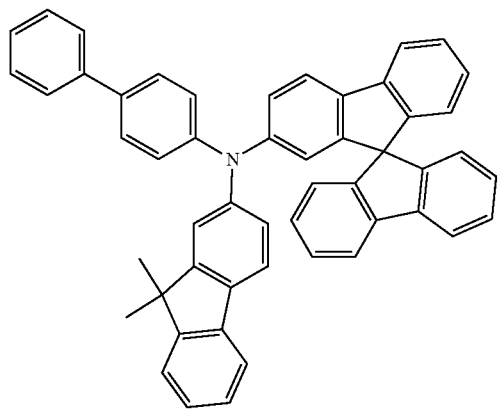
HT41
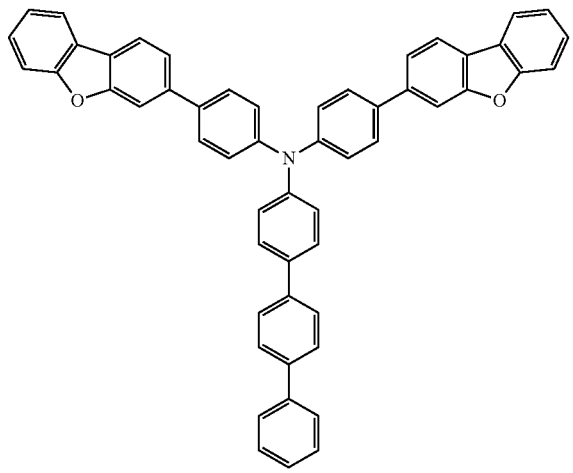
HT42
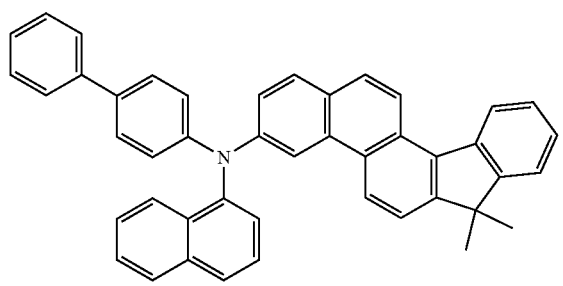
HT43
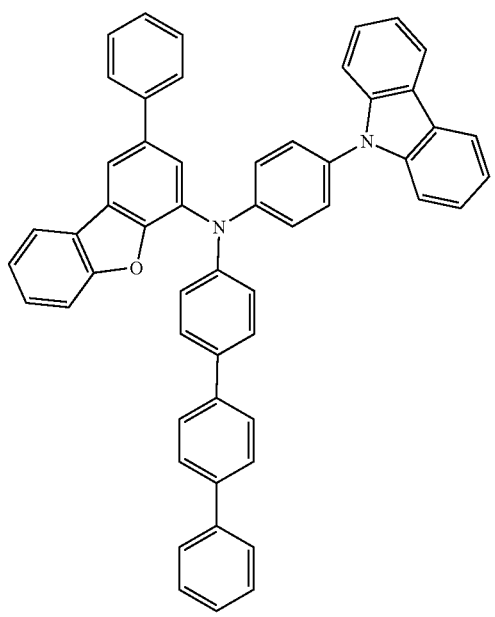

-continued
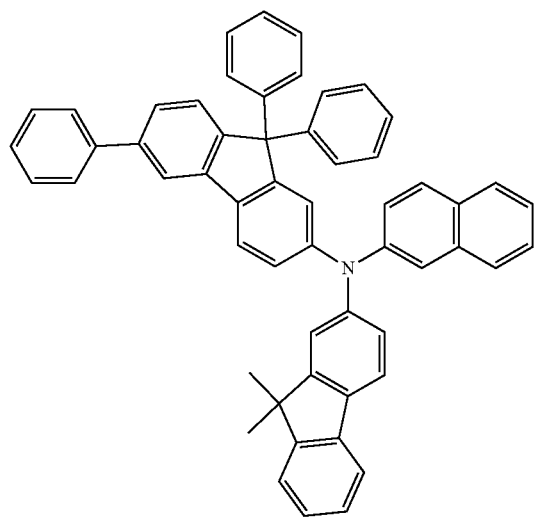
HT44
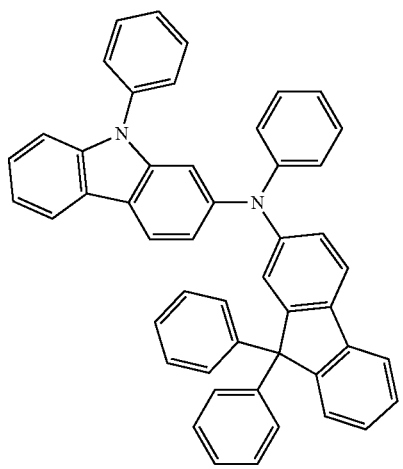
HT45
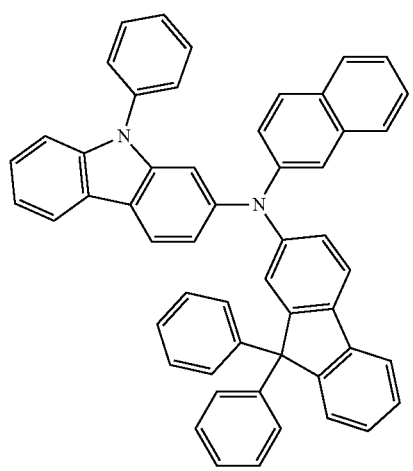
HT46
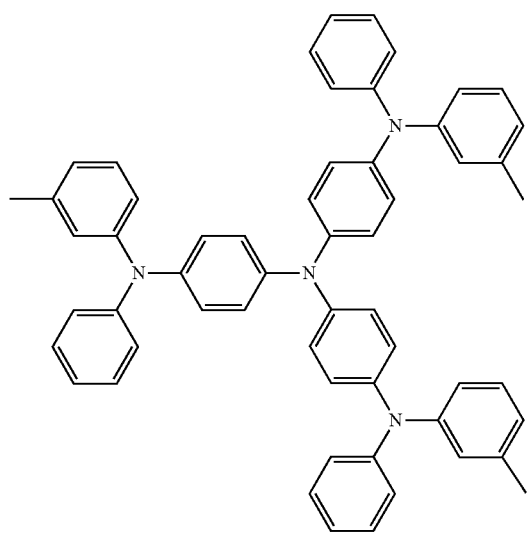
m-MTDATA
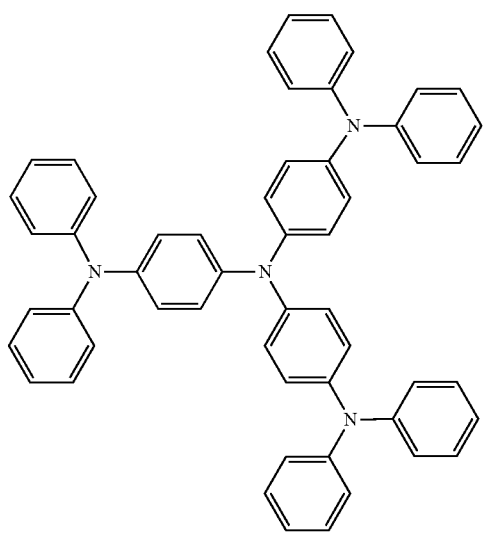
TDATA

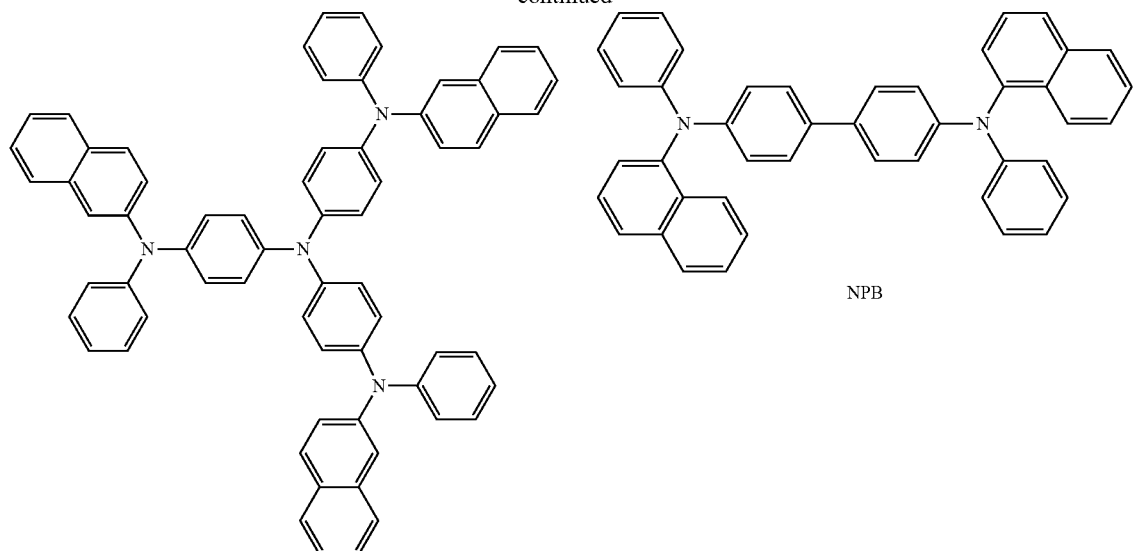
2-TNATA
NPB
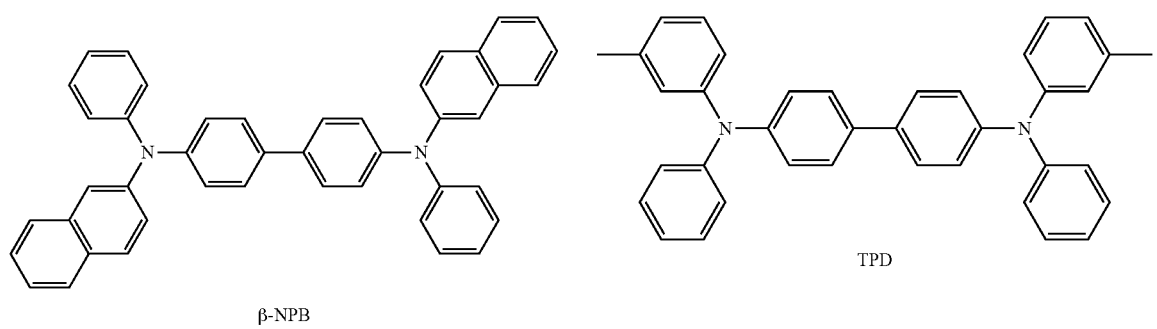
β-NPB
TPD
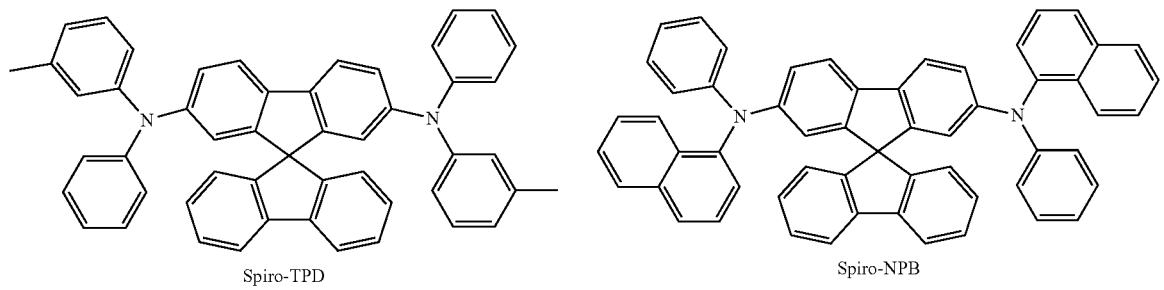
Spiro-TPD
Spiro-NPB
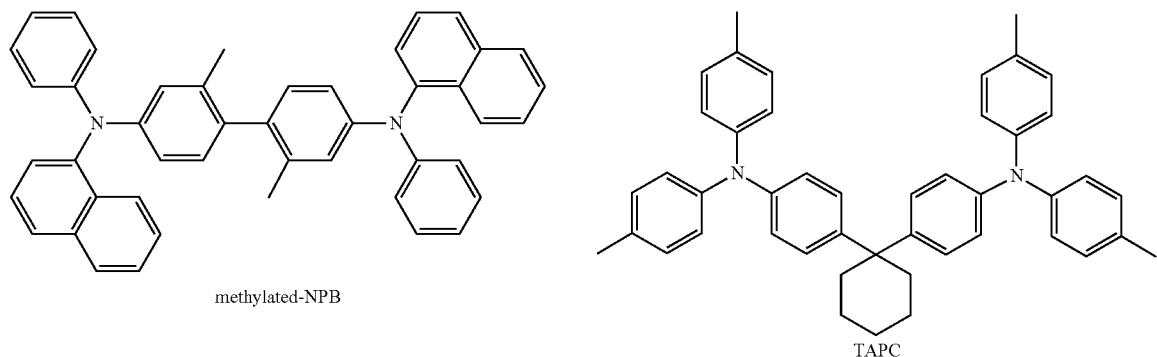
methylated-NPB
TAPC

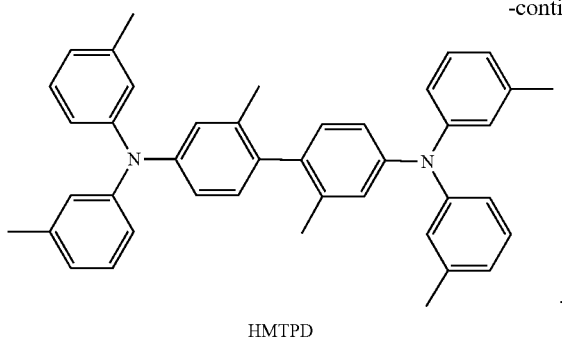

HMTPD

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within any of these ranges, satisfactory (or suitable) hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block or reduce the leakage of electrons from an emission layer to a hole transport region. Materials that may be included in the hole transport region may be included in the emission auxiliary layer and/or the electron blocking layer.

p-Dopant

The hole transport region may further include, in addition to these materials, a charge-generation material for the improvement of conductive properties. The charge-generation material may be uniformly or non-uniformly dispersed in the hole transport region (for example, in the form of a single layer including or consisting of a charge-generation material).

The charge-generation material may be, for example, a p-dopant.

For example, the lowest unoccupied molecular orbital (LUMO) energy level of the p-dopant may be −3.5 eV or less.

In one or more embodiments, the p-dopant may include a quinone derivative, a cyano group-containing compound, a compound including element EL1 and element EL2, or any combination thereof.

Examples of the quinone derivative may include TCNQ, F4-TCNQ, etc.

Examples of the cyano group-containing compound may include HAT-CN, and a compound represented by Formula 221 below:

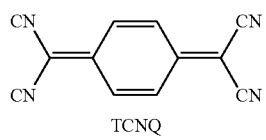

TCNQ

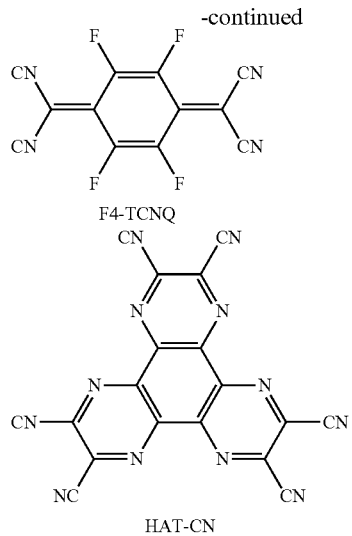

F4-TCNQ

HAT-CN

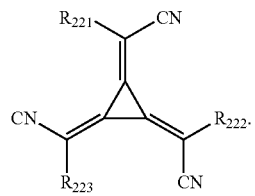

Formula 221

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one selected from $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be metal, metalloid, or any combination thereof, and element EL2 may be non-metal, metalloid, or any combination thereof.

Examples of the metal may include an alkali metal (for example, lithium (Li), sodium (Na), potassium (K), rubidium (Rb), cesium (Cs), etc.); alkaline earth metal (for example, beryllium (Be), magnesium (Mg), calcium (Ca), strontium (Sr), barium (Ba), etc.); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); post-transition metal (for example, zinc (Zn), indium (In), tin (Sn), etc.); and lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and halogen (for example, F, Cl, Br, I, etc.).

Examples of the compound including element EL1 and element EL2 may include metal oxide, metal halide (for example, metal fluoride, metal chloride, metal bromide, and/or metal iodide), metalloid halide (for example, metalloid fluoride, metalloid chloride, metalloid bromide, and/or metalloid iodide), metal telluride, or any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide may include alkali metal halide, alkaline earth metal halide, transition metal halide, post-transition metal halide, and lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdC_{12}$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide may include zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, and $SmI_3$.

An example of the metalloid halide may include antimony halide (for example, $SbCl_5$, etc.).

Examples of the metal telluride may include alkali metal telluride (for example, $Li_2Te$, a $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

The emission layer may have a structure including a single quantum dot layer or a structure in which two or more quantum dot layers are stacked. For example, the emission layer may have a structure including a single quantum dot layer or a structure in which 2 to 100 quantum dot layers are stacked.

The emission layer may include the quantum dot according to the present embodiments.

In addition to the quantum dot according to the present embodiments, the emission layer may further include a quantum dot different therefrom.

In addition to the quantum dot according to the present embodiments, the emission layer may further include a dispersion medium in which the quantum dots are dispersed in a naturally coordinated form. The dispersion medium may include an organic solvent, a polymer resin, or any combination thereof. The dispersion medium may be any transparent medium that does not substantially affect the wavelength conversion performance of the quantum dots, does not substantially change due to light or reflect light, and does not cause substantial absorption of light. For example, the organic solvent may include toluene, chloroform, ethanol, octane, or any combination thereof, and the polymer resin may include an epoxy resin, a silicone resin, a polystylene resin, an acrylate resin, or any combination thereof.

The emission layer may be formed by coating a composition for forming an emission layer including quantum dots on the hole transport region and volatizing at least part of a solvent included in the composition for forming an emission layer.

For example, water, hexane, chloroform, toluene, or octane may be used as the solvent.

The composition for forming an emission layer may be coated using a spin coating method, a casting method, a micro gravure coating method, a gravure coating method, a bar coating method, a roll coating method, a wire bar coating method, a dip coating method, a spray coating method, a screen printing method, a flexographic printing method, an offset printing method, an ink jet printing method, and/or the like.

When the light-emitting device 10 is a full-color light-emitting device, the emission layer 150 may include an emission layer that emits light of different colors for each sub-pixel.

In one or more embodiments, the emission layer 150 may be patterned, for each subpixel, as a first color emission layer, a second color emission layer, and a third color emission layer. In this regard, at least one emission layer from among the above-described emission layers may necessarily include the quantum dot. In one or more embodiments, the first color emission layer may be a quantum dot emission layer including a quantum dot, and the second color emission layer and the third color emission layer may be organic emission layers including organic compounds, respectively. In this regard, the first color through the third color are different colors, and for example, the first color through the third color may have different maximum luminescence wavelengths. The first color through the third color may be white when combined with each other.

In one or more embodiments, the emission layer may further include a fourth color emission layer, and at least one selected from the first to fourth color emission layers may be a quantum dot emission layer including quantum dots, and the remaining emission layers may be organic emission layers including organic compounds. In this regard, the first color through the fourth color are different colors, and for example, the first color through the fourth color may have different maximum luminescence wavelengths. The first color through the fourth color may be white when combined with each other.

In one or more embodiments, the light-emitting device 10 may have a stacked structure in which two or more emission layers emitting light of identical or different colors contact each other or are separated from each other. At least one emission layer of the two or more emission layers may be a quantum dot emission layer including the quantum dots, and other emission layer(s) may be organic emission layer(s) including organic compounds. Such variations may be made. For example, the light-emitting device 10 may include a first color emission layer and a second color emission layer, and the first color and the second color may be identical or different colors. In one or more embodiments, both the first color and the second color may be blue.

The emission layer may further include at least one selected from an organic compound and a semiconductor compound, in addition to the quantum dot.

In one or more embodiments, the organic compound may include a host and a dopant. The host and the dopant may be any host and dopant suitable for use in an organic light-emitting device.

In one or more embodiments, the semiconductor compound may be an organic perovskite and/or an inorganic perovskite.

Electron Transport Region in Interlayer 130

The electron transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, the constituting layers of each structure being sequentially stacked from an emission layer.

The electron transport region may include a conductive metal oxide. For example, the electron transport region may include ZnO, $TiO_2$, $WO_3$, $SnO_2$, $In_2O_3$, $Nb_2O_5$, $Fe_2O_3$, $CeO_2$, $SrTiO_3$, $Zn_2SnO_4$, $BaSnO_3$, $In_2S_3$, ZnSiO, $PC_{60}BM$, $PC_{70}BM$, Mg-doped ZnO (ZnMgO), Al-doped ZnO (AZO), Ga-doped ZnO (GZO), In-doped ZnO(IZO), Al-doped $TiO_2$, Ga-doped $TiO_2$, In-doped $TiO_2$, Al-doped $WO_3$, Ga-doped $WO_3$, In-doped $WO_3$, Al-doped $SnO_2$, Ga-doped $SnO_2$, In-doped $SnO_2$, Mg-doped $In_2O_3$, Al-doped $In_2O_3$, Ga-doped $In_2O_3$, Mg-doped $Nb_2O_5$, Al-doped $Nb_2O_5$, Ga-doped $Nb_2O_5$, Mg-doped $Fe_2O_3$, Al-doped $Fe_2O_3$, Ga-doped $Fe_2O_3$, In-doped $Fe_2O_3$, Mg-doped $CeO_2$, Al-doped $CeO_2$, Ga-doped $CeO_2$, In-doped $CeO_2$, Mg-doped $SrTiO_3$, Al-doped $SrTiO_3$, Ga-doped $SrTiO_3$, In-doped $SrTiO_3$, Mg-doped $Zn_2SnO_4$, Al-doped $Zn_2SnO_4$, Ga-doped $Zn_2SnO_4$, In-doped $Zn_2SnO_4$, Mg-doped $BaSnO_3$, Al-doped $BaSnO_3$, Ga-doped $BaSnO_3$, In-doped $BaSnO_3$, Mg-doped $In_2S_3$, Al-doped $In_2S_3$, Ga-doped $In_2S_3$, In-doped $In_2S_3$, Mg-doped ZnSiO, Al-doped ZnSiO, Ga-doped ZnSiO, In-doped ZnSiO, or any combination thereof.

In one or more embodiments, the electron transport region (for example, the buffer layer, the hole blocking layer, the electron control layer, and/or the electron transport layer in the electron transport region) may include a metal-free compound including at least one π electron-deficient nitrogen-containing $C_1$-$C_{60}$ cyclic group.

For example, the electron transport region may include a compound represented by Formula 601 below:

$$[Ar_{601}]_{xe11}\text{-}[(L_{601})_{xe1}\text{-}R_{601}]_{xe21},\quad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each be the same as described herein with respect to $Q_1$, xe21 may be 1, 2, 3, 4, or 5, at least one selected from $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked to each other via a single bond.

In one or more embodiments, $Ar_{601}$ in Formula 601 may be a substituted or unsubstituted anthracene group.

In one or more embodiments, the electron transport region may include a compound represented by Formula 601-1:

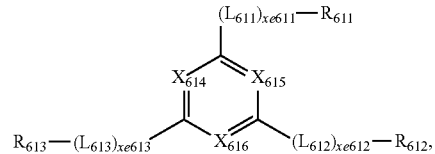

Formula 601-1 wherein, in Formula 601-1, $X_{614}$ may be N or C($R_{614}$), $X_{615}$ may be N or C($R_{615}$), $X_{616}$ may be N or C($R_{616}$), and at least one selected from $X_{614}$ to $X_{616}$ may be N, $L_{611}$ to $L_{613}$ may each be the same as described herein with respect to $L_{601}$, xe611 to xe613 may each be the same as described herein with respect to xe1, $R_{611}$ to $R_{613}$ may each be the same as described herein with respect to $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

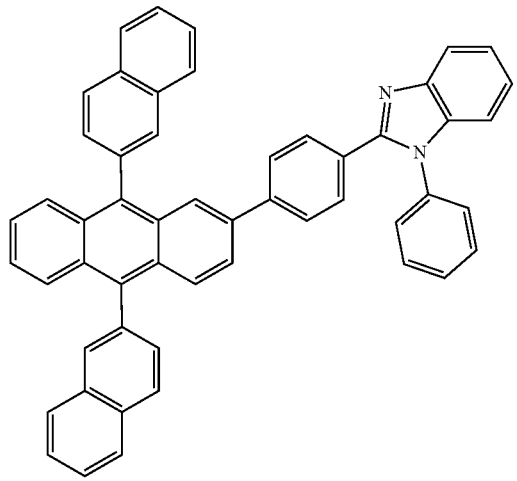

ET2

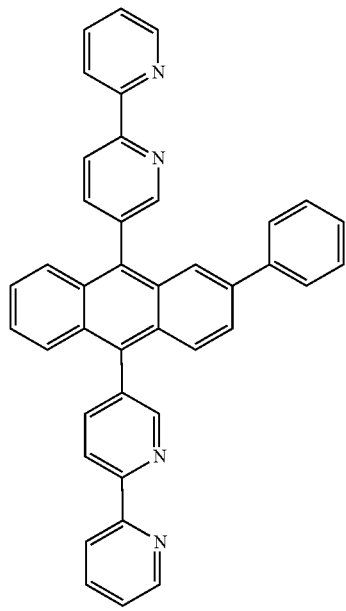

ET3

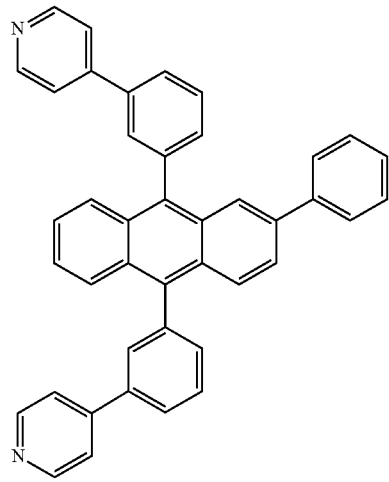

ET4

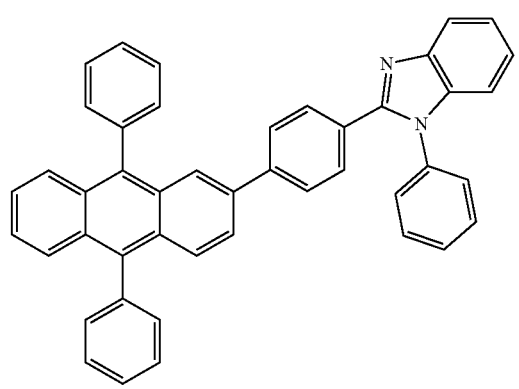

ET5

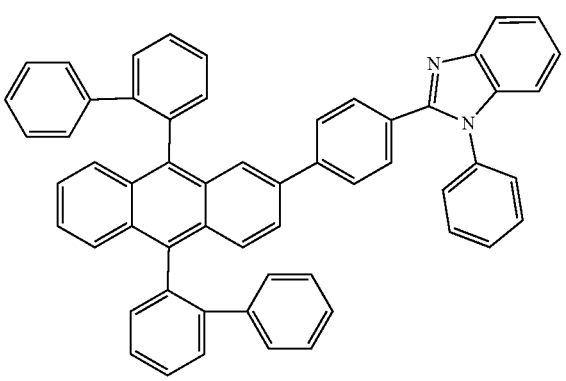

ET6
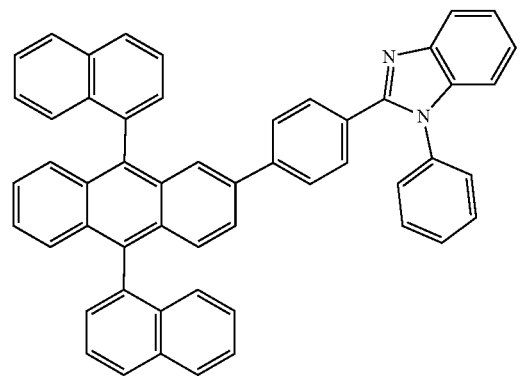
ET7
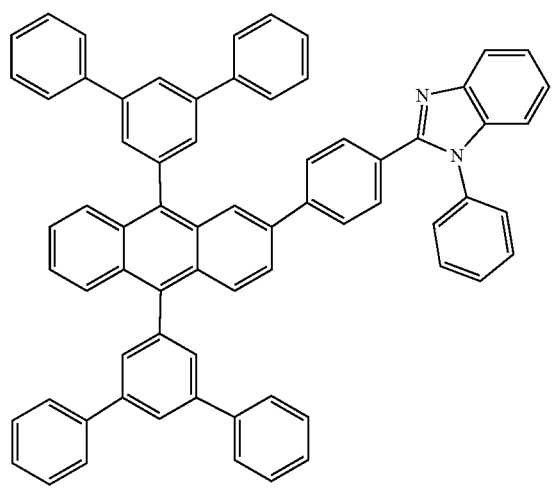
ET8
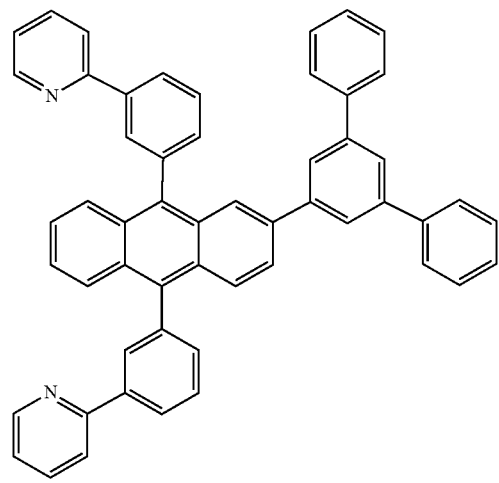
ET9
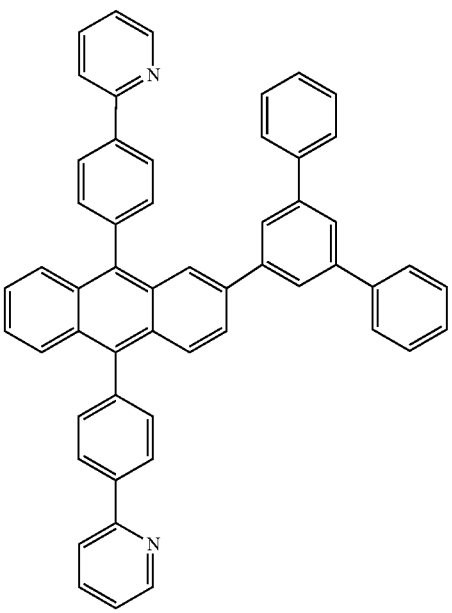
ET10
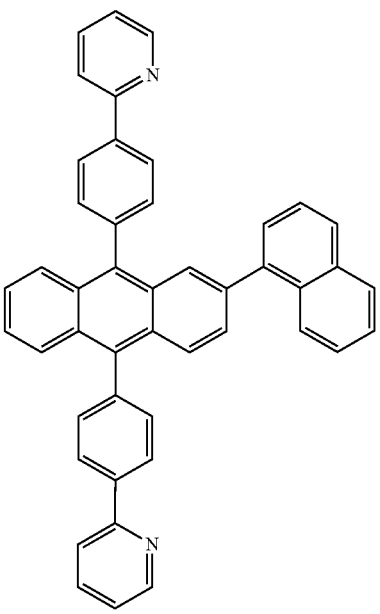

ET11
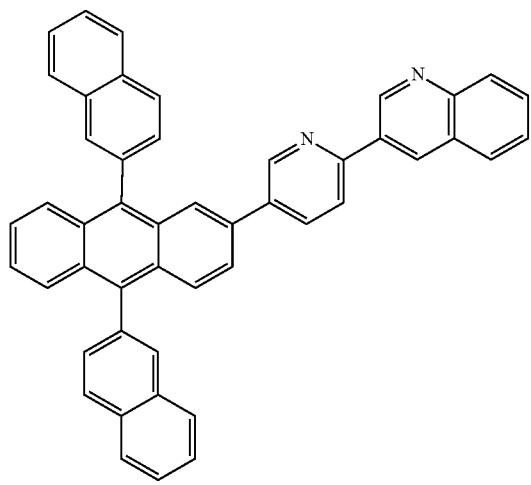
ET14
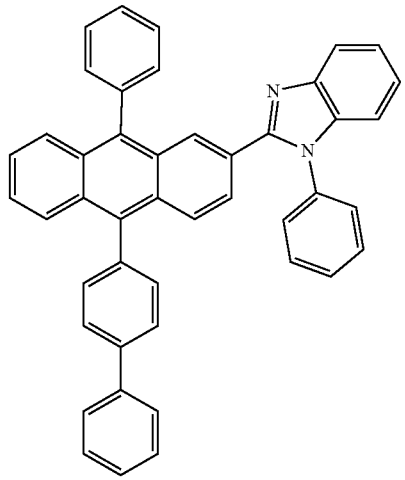
ET12
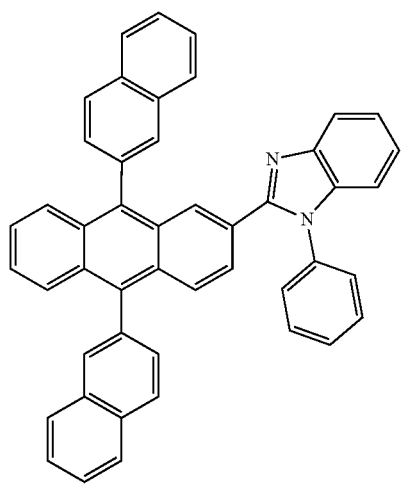
ET15
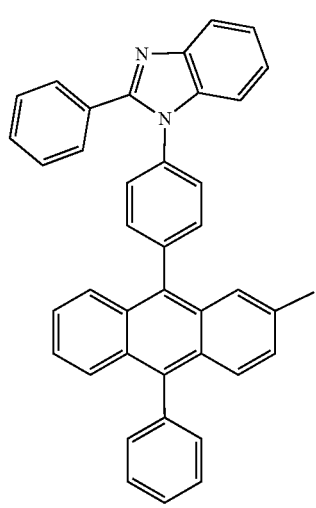
ET13
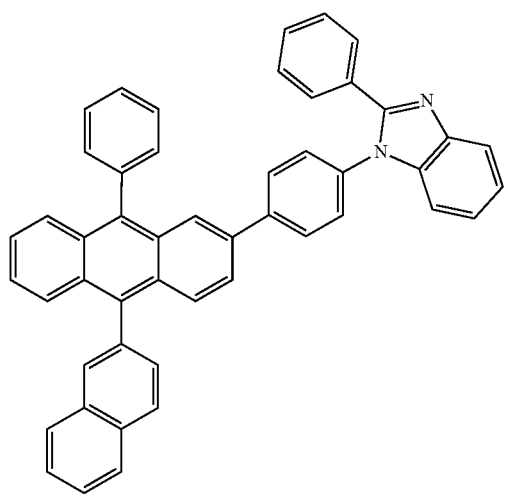
ET16
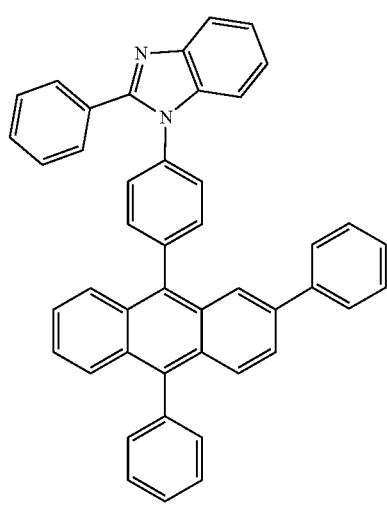

ET17
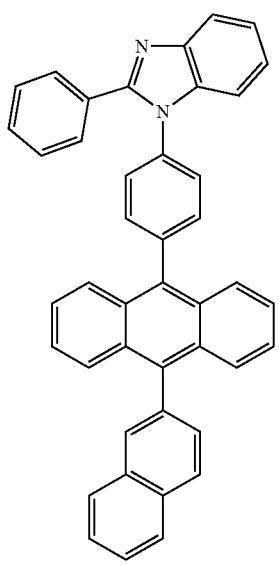
ET18
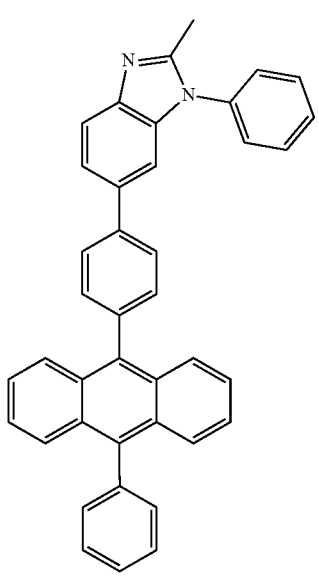
ET19
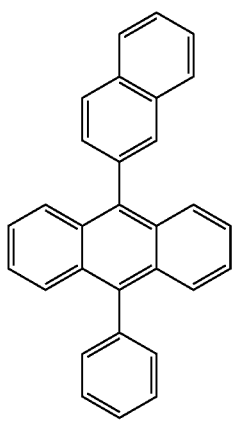
ET20
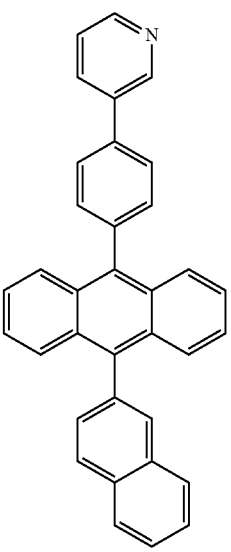
ET21
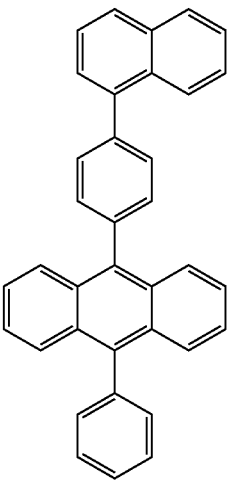
ET22
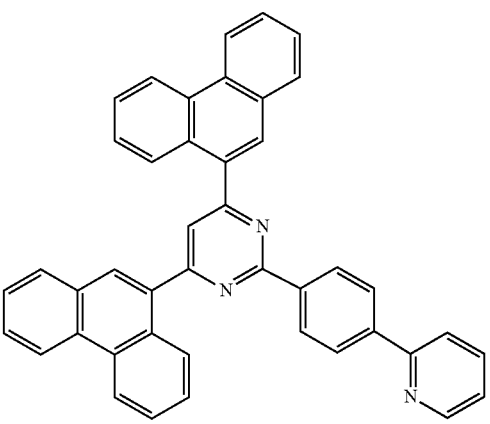

ET23
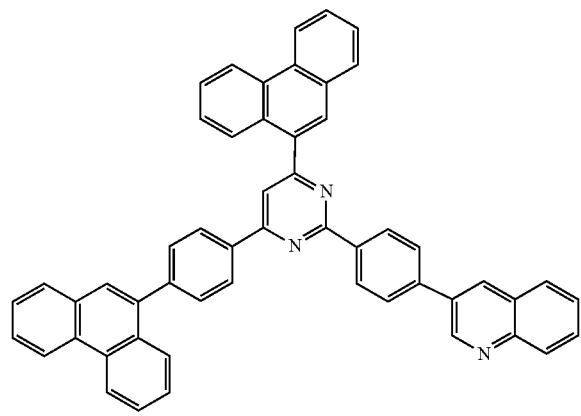
ET24
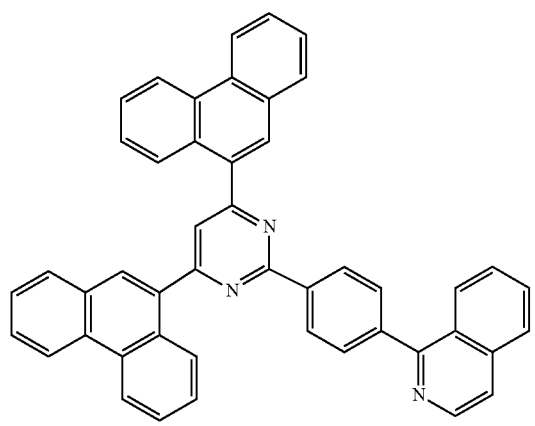
ET25
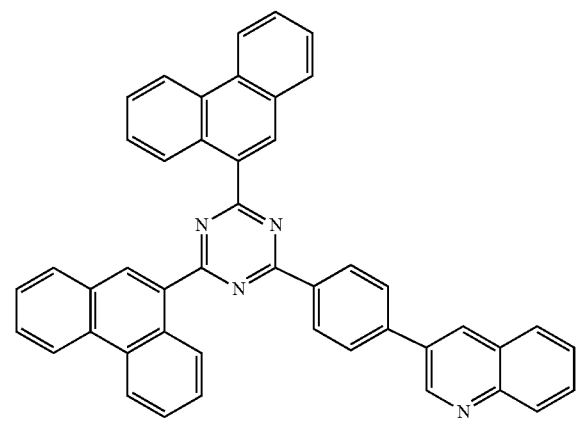
ET26
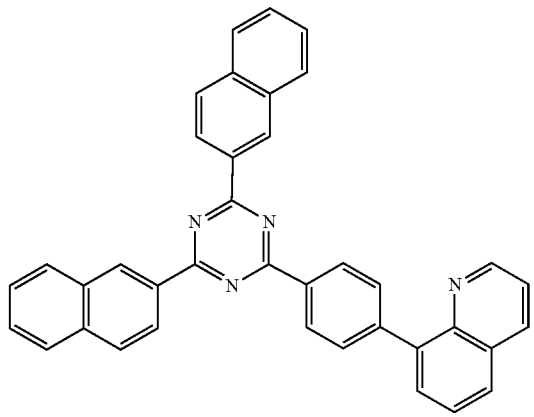
ET27
ET28
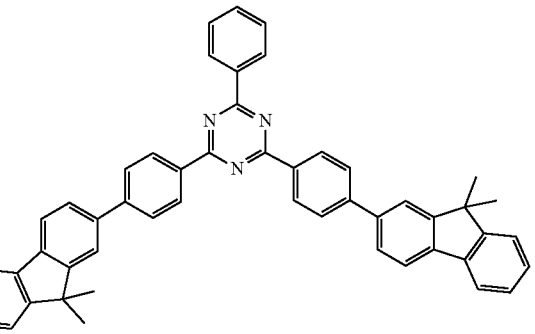

ET29
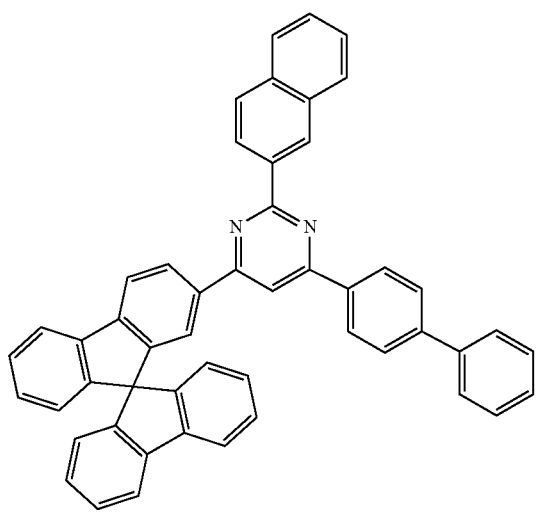
ET30
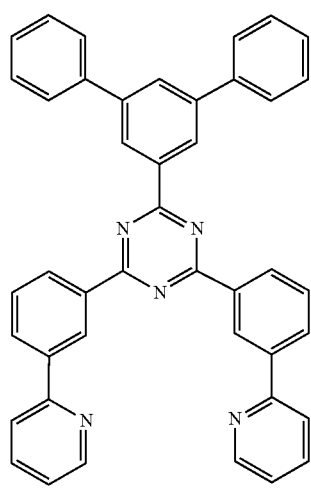
ET31
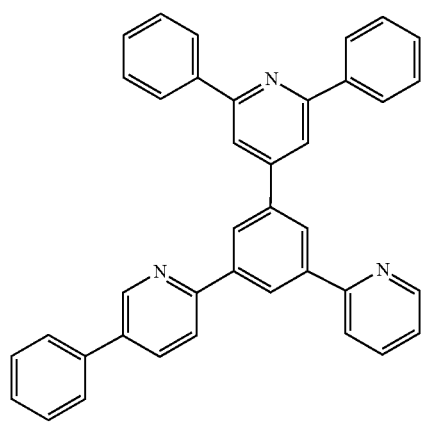
ET32
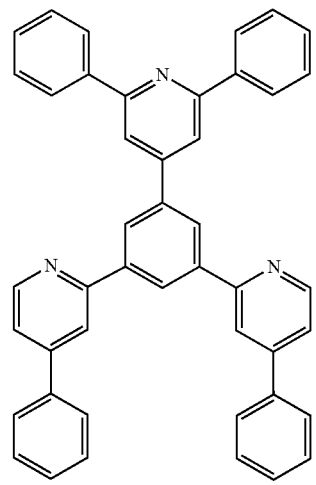
ET33
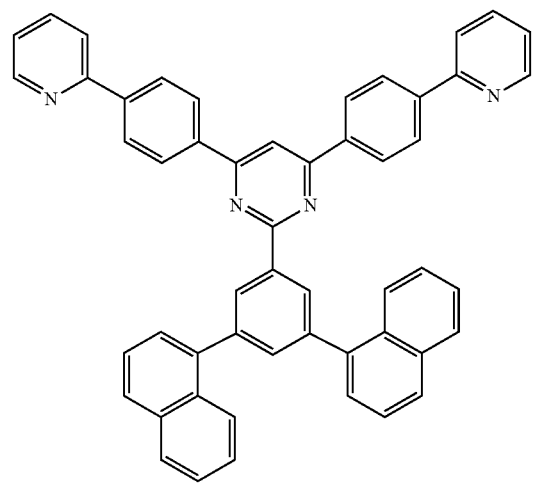
ET34

ET35
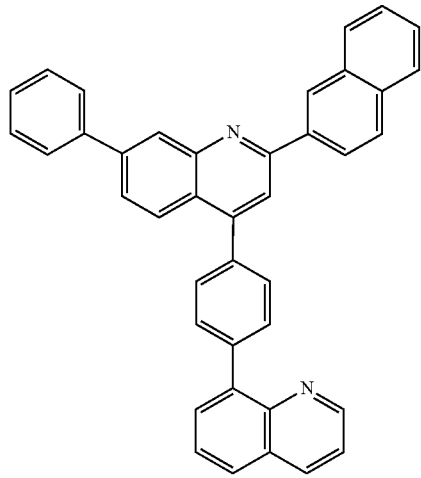
ET36
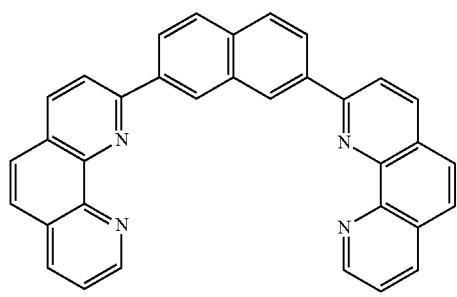
ET37
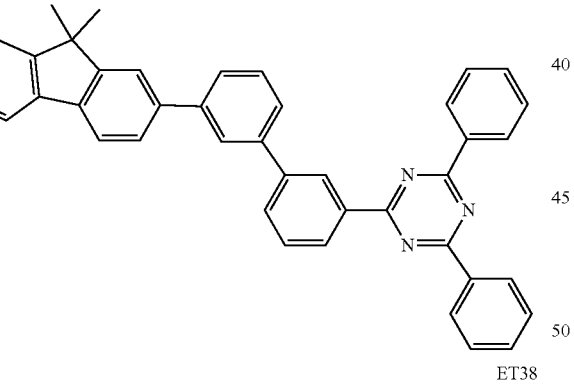
ET38
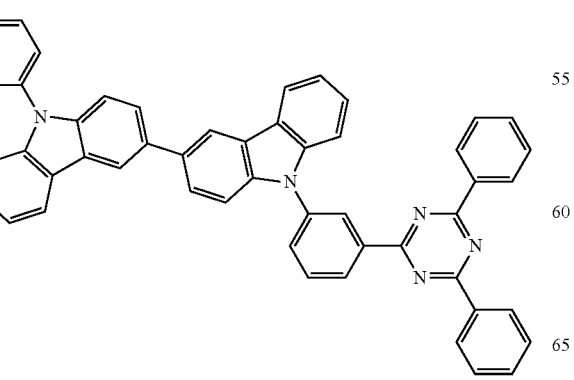
ET39
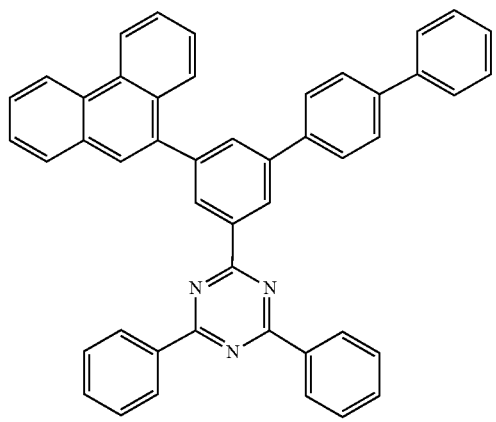
ET40
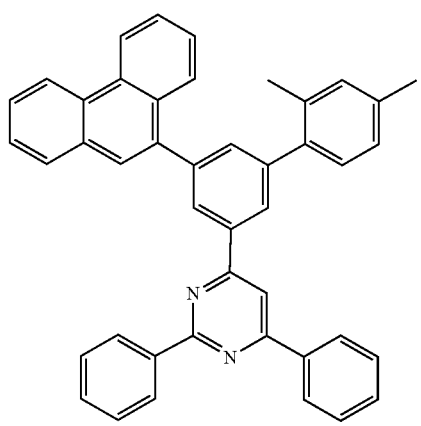
ET41
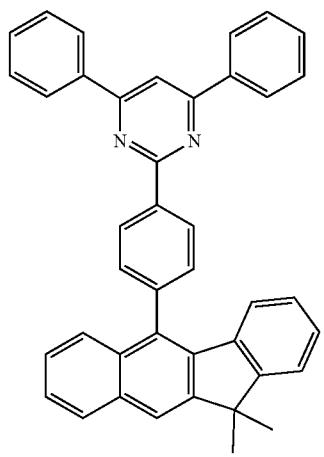

-continued

ET42

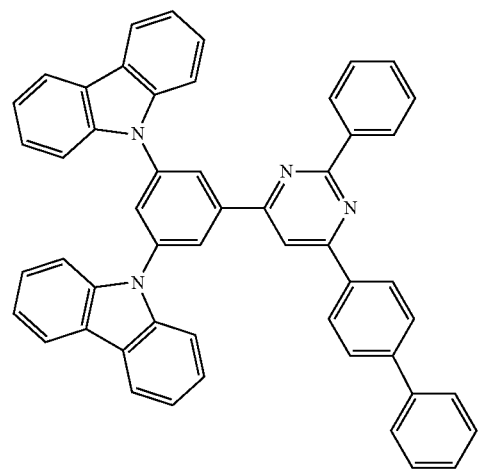

ET43

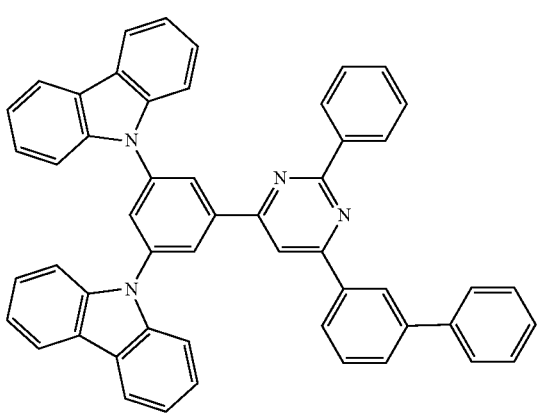

ET44

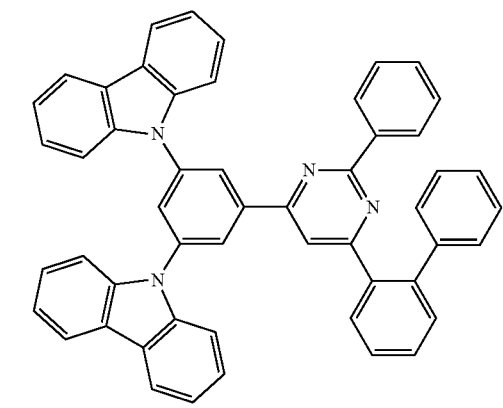

ET45

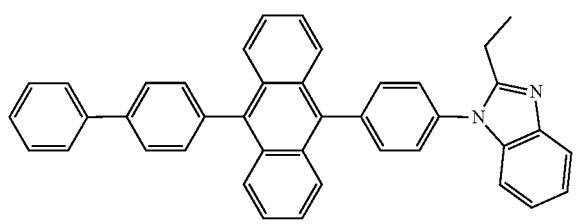

-continued

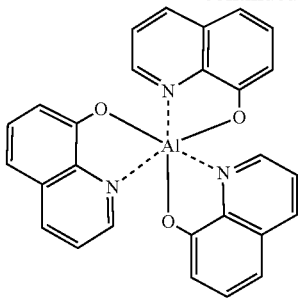

Alq₃

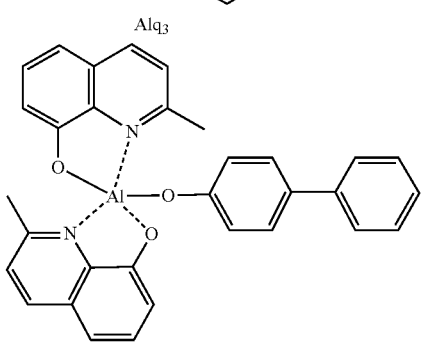

BAlq

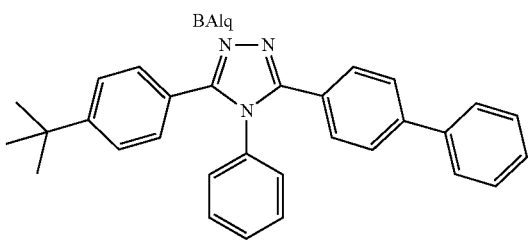

TAZ

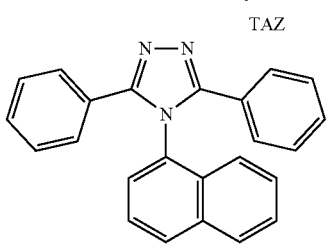

NTAZ

A thickness of the electron transport region may be from about 100 Å to about 5,000 Å, for example, about 160 Å to about 4,000 Å. When the electron transport region includes a buffer layer, a hole blocking layer, an electron control layer, an electron transport layer, or any combination thereof, the thickness of the buffer layer, the hole blocking layer, and/or the electron control layer may each independently be from about 20 Å to about 1000 Å, for example, about 30 Å to about 300 Å, and the thickness of the electron transport layer may be from about 100 Å to about 1000 Å, for example, about 150 Å to about 500 Å. When the thickness(es) of the buffer layer, the hole blocking layer, the electron control layer, the electron transport layer, and/or the electron transport layer are within any of these ranges, satisfactory (or suitable) electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. The metal ion of an alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) and/or Compound ET-D2:

ET-D1

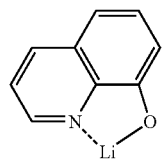

ET-D2

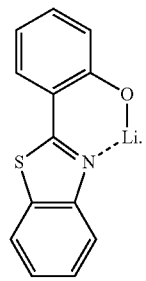

The electron transport region may include an electron injection layer that facilitates the injection of electrons from the second electrode 150. The electron injection layer may directly contact the second electrode 150.

The electron injection layer may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, alkaline earth metal, a rare earth metal, an alkali metal-containing compound, alkaline earth metal-containing compound, a rare earth metal-containing compound, an alkali metal complex, an alkaline earth metal complex, a rare earth metal complex, or any combination thereof.

The alkali metal may include Li, a Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be selected from oxides, halides (for example, fluorides, chlorides, bromides, and/or iodides), and tellurides of the alkali metal, the alkaline earth metal, and the rare earth metal, and combinations thereof.

The alkali metal-containing compound may include: alkali metal oxides (such as $Li_2O$, $Cs_2O$, and/or $K_2O$); alkali metal halides (such as LiF, NaF, CsF, KF, LiI, NaI, CsI, and/or KI); or any combination thereof. The alkaline earth metal-containing compound may include an alkaline earth metal compound, such as BaO, SrO, CaO, $Ba_xSr_{1-x}O$ (wherein x is a real number satisfying the condition of $0<x<1$), $Ba_xCa_{1-x}O$ (wherein x is a real number satisfying the condition of $0<x<1$), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may include (e.g., may consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may include (e.g., may consist of): i) an alkali metal-containing compound (for example, an alkali metal halide); or ii) a) an alkali metal-containing compound (for example, an alkali metal halide), and b) an alkali metal, an alkaline earth metal, a rare earth metal, or any combination thereof. For example, the electron injection layer may be a KI:Yb co-deposited layer, an RbI:Yb co-deposited layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be uniformly or non-uniformly dispersed in a matrix including the organic material.

A thickness of the electron injection layer may be in a range of about 1 Å to about 100 Å, and, for example, about 3 Å to about 90 Å. When the thickness of the electron injection layer is within any of the ranges described above, satisfactory (or suitable) electron injection characteristics may be obtained without a substantial increase in driving voltage.

Second Electrode 150

The second electrode 150 may be located on the interlayer 130 having the structure according to embodiments of the present disclosure. The second electrode 150 may be a cathode, which is an electron injection electrode, and as the material for the second electrode 150, a metal, an alloy, an electrically conductive compound, or any combination thereof, each having a low-work function, may be used.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including a plurality of layers.

Electronic Apparatus

The light-emitting device may be included in various suitable electronic apparatuses. For example, the electronic apparatus including the light-emitting device may be a light-emitting apparatus, an authentication apparatus, and/or the like.

The electronic apparatus (for example, a light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. For example, the light emitted from the light-emitting device may be blue light or white light. For details on the light-emitting device, related description provided above may be referred to. In one or more embodiments, the color conversion layer may include a quantum dot. The quantum dot may be, for example, a quantum dot according to the present embodiments.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be located among the subpixel areas to define each of the subpixel areas.

The color filter may further include a plurality of color filter areas and light-shielding patterns located among the color filter areas, and the color conversion layer may further include a plurality of color conversion areas and light-shielding patterns located among the color conversion areas.

The plurality of color filter areas (and/or the plurality of color conversion areas) may include a first area emitting (e.g., to emit) first color light, a second area emitting (e.g., to emit) second color light, and/or a third area emitting (e.g., to emit) third color light, wherein the first color light, the second color light, and/or the third color light may have different maximum emission wavelengths from one another. For example, the first color light may be red light, the second color light may be green light, and the third color light may be blue light. For example, the plurality of color filter areas (and/or the plurality of color conversion areas) may include quantum dots. In one or more embodiments, the first area may include a red quantum dot, the second area may include a green quantum dot, and the third area may not include a quantum dot. For details on the quantum dot, related descriptions provided herein may be referred to. The first area, the second area, and/or the third area may include a scatterer.

For example, the light-emitting device may emit first light, the first area may absorb the first light to emit first-first color light, the second area may absorb the first light to emit second-first color light, and the third area may absorb the first light to emit third-first color light. In this regard, the first-first color light, the second-first color light, and the third-first color light may have different maximum emission wavelengths. For example, the first light may be blue light, the first-first color light may be red light, the second-first color light may be green light, and the third-first color light may be blue light.

The electronic apparatus may further include a thin-film transistor, in addition to the light-emitting device as described above. The thin-film transistor may include a source electrode, a drain electrode, and an activation layer, wherein one of the source electrode or the drain electrode may be electrically connected (e.g., electrically coupled) to a corresponding one of the first electrode or the second electrode of the light-emitting device.

The thin-film transistor may further include a gate electrode, a gate insulating film, and/or the like.

The activation layer may include crystalline silicon, amorphous silicon, an organic semiconductor, an oxide semiconductor, and/or the like.

The electronic apparatus may further include a sealing portion for sealing the light-emitting device. The sealing portion may be located between the color conversion layer and/or color filter and the light-emitting device. The sealing portion allows light from the light-emitting device to be extracted to the outside, and simultaneously (or concurrently) prevents or reduces ambient air and moisture from penetrating into the light-emitting device. The sealing portion may be a sealing substrate including a transparent glass substrate and/or a plastic substrate. The sealing portion may be a thin-film encapsulation layer including at least one layer of an organic layer and/or an inorganic layer. When the sealing portion is a thin film encapsulation layer, the electronic apparatus may be suitably flexible.

Various functional layers may be additionally located on the sealing portion, in addition to the color filter and/or the color conversion layer, according to the use of the electronic apparatus. Examples of the functional layers may include a touch screen layer, a polarizing layer, and the like. The touch screen layer may be a pressure-sensitive touch screen layer, a capacitive touch screen layer, and/or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device as described above, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various measuring instruments, meters (for example, meters for a vehicle, an aircraft, and/or a vessel), projectors, and/or the like.

Manufacturing Method

The layers included in the hole transport region, the emission layer, and the layers included in the electron transport region may be formed in a certain region by using one or more suitable methods such as vacuum deposition, spin coating, casting, Langmuir-Blodgett (LB) deposition, ink-jet printing, laser-printing, laser-induced thermal imaging, and/or the like.

When layers constituting the hole transport region, the emission layer, and layers constituting the electron transport region are each independently formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of Terms

"Conjugate base" as used herein refers to a compound from which one hydrogen ion (proton, $H^+$) is removed. For example, the conjugate base of a carboxylic acid group (—COOH) is —COO⁻, wherein one hydrogen ion is removed from the carboxylic acid group.

The term "$C_3$-$C_{60}$ carbocyclic group" as used herein refers to a cyclic group consisting of carbon atoms only as ring-forming atoms and having three to sixty carbon atoms, and the term "$C_1$-$C_{60}$ heterocyclic group" as used herein refers to a cyclic group that has one to sixty carbon atoms and further has, in addition to carbon, at least one heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_{60}$ heterocyclic group has 3 to 61 ring-forming atoms.

The "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

For example, the $C_3$-$C_{60}$ carbocyclic group may be i) group T1 or ii) a condensed cyclic group in which two or more groups T1 are condensed with each other (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, and/or an indenoanthracene group), the $C_1$-$C_{60}$ heterocyclic group may be i) group T2, ii) a condensed cyclic group in which two or more groups T2 are condensed with each other, or iii) a condensed cyclic group in which at least one group T2 and at least one group T1 are condensed with each other (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) group T1, ii) a condensed cyclic group in which at least two groups T1 are condensed with each other, iii) group T3, iv) a condensed cyclic group in which at least two groups T3 are condensed with each other, or v) a condensed cyclic group in which at least one group T3 and at least one group T1 are condensed with each other (for example, the π electron-rich $C_3$-$C_{60}$ cyclic group may be the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, the π electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.),

- group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, and/or a benzene group,
- group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, and/or a dihydropyridazine group,
- group T3 may be a furan group, a thiophene group, a 1H-pyrrole group, a silole group, and/or a borole group, and
- group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, and/or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, and/or the π electron-deficient nitrogen-containing $C_1$-$C_{60}$ cyclic group" as used herein refer to a condensed cyclic group, a monovalent group, and/or a polyvalent group (for example, a divalent group, a trivalent group, a tetravalent group, etc.) according to the structure of a formula for which the corresponding term is used. For example, the "benzene group" may be a benzo group, a phenyl group, a phenylene group, or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle and/or at the terminus of the $C_2$-$C_{60}$ alkyl group, and examples thereof may include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle and/or at the terminus of the $C_2$-$C_{60}$ alkyl group, and examples thereof may include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein Ani is the $C_1$-$C_{60}$ alkyl group), and examples thereof may include a methoxy group, an ethoxy group, and an isopropyloxy (e.g., isopropoxy) group.

The term "$C_3$-$C_{10}$ cycloalkyl group" as used herein refers to a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo [2.2.1]heptyl group), a bicyclo[1.1.1]pentyl group, a bicyclo [2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group of 1 to 10 carbon atoms, further including, in addition to carbon atoms, at least one heteroatom as a ring-forming atom, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term $C_3$-$C_{10}$ cycloalkenyl group used herein refers to a monovalent cyclic group that has 3 to 10 carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group of 1 to 10 carbon atoms, further including, in addition to carbon atoms, at least one heteroatom as a ring-forming atom, and having at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system of 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. The term "$C_6$-$C_{60}$ arylene group" as used herein refers to a divalent group having the same structure as the $C_6$-$C_{60}$ aryl group. When the $C_6$-$C_{60}$ aryl group and the $C_6$-$C_{60}$ arylene group each independently include two or more rings, the respective rings may be condensed with each other.

The term "$C_1$-$C_{60}$ heteroaryl group" as used herein refers to a monovalent group having a heterocyclic aromatic system of 1 to 60 carbon atoms, further including, in addition to carbon atoms, at least one heteroatom as a ring-forming atom. The term "$C_1$-$C_{60}$ heteroarylene group" as used herein refers to a divalent group having the same structure as the $C_1$-$C_{60}$ heteroaryl group. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a carbazolyl group, and a naphthyridinyl group. When the $C_1$-$C_{60}$ heteroaryl group and the $C_1$-$C_{60}$ heteroarylene group each independently include two or more rings, the respective rings may be condensed with each other.

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group may include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein refers to a divalent group having the same structure as the monovalent non-aromatic condensed polycyclic group described above.

The term "monovalent non-aromatic condensed heteropolycyclic group" as used herein refers to a monovalent group (for example, having 1 to 60 carbon atoms) having two or more rings condensed to each other, further including, in addition to carbon atoms, at least one heteroatom as a ring-forming atom, and having no aromaticity in its entire molecular structure. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as the monovalent non-aromatic condensed heteropolycyclic group described above.

The term "$C_6$-$C_{60}$ aryloxy group" as used herein may refer to a monovalent group represented by —$OA_{102}$ (wherein $A_{102}$ is the $C_6$-$C_{60}$ aryl group), and the term "$C_6$-$C_{60}$ arylthio group" as used herein may refer to a monovalent group represented by —$SA_{103}$ (wherein $A_{103}$ is the $C_6$-$C_{60}$ aryl group).

The term "$C_7$-$C_{60}$ aryl alkyl group" used herein refers to a monovalent group represented by -$A_{104}A_{105}$ (where $A_{104}$ may be a $C_1$-$C_{54}$ alkylene group, and $A_{105}$ may be a $C_6$-$C_{59}$ aryl group), and the term $C_2$-$C_{60}$ heteroaryl alkyl group" used herein refers to a monovalent group represented by -$A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as used herein refers to:

deuterium (-D), —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as used herein refers to any atom other than a carbon atom. Examples of the heteroatom may include O, S, N, P, Si, B, Ge, Se, and any combinations thereof.

The term "third-row transition metal" used herein includes hafnium (Hf), tantalum (Ta), tungsten (W), rhenium (Re), osmium (Os), iridium (Ir), platinum (Pt), gold (Au), and the like.

"Ph" as used herein refers to a phenyl group, "Me" as used herein refers to a methyl group, "Et" as used herein refers to an ethyl group, "ter-Bu" or "But" as used herein refers to a tert-butyl group, and "OMe" as used herein refers to a methoxy group.

The term "biphenyl group" as used herein refers to "a phenyl group substituted with a phenyl group." For example, the "biphenyl group" may be a substituted phenyl group having a $C_6$-$C_{60}$ aryl group as a substituent.

The term "terphenyl group" as used herein refers to "a phenyl group substituted with a biphenyl group". For example, the "terphenyl group" may be a substituted phenyl group having, as a substituent, a $C_6$-$C_{60}$ aryl group substituted with a $C_6$-$C_{60}$ aryl group.

\* and \*' as used herein, unless defined otherwise, each refer to a binding site to a neighboring atom in a corresponding formula or moiety.

Hereinafter, compounds according to embodiments and light-emitting devices according to embodiments will be described in more detail with reference to the following synthesis examples and examples. The phrase "B was used instead of A" used in describing Synthesis Examples means that an identical molar equivalent of B was used in place of A.

EXAMPLES

Example 1

1. Synthesis of ZnSeTe Core 1.7 mmol of zinc acetate was dissolved in 1.5 ml of oleic acid and 15 ml of octadecene in a reaction flask and heated at a temperature of 100° C. under vacuum. After 1 hour, an atmosphere of a reactor was changed to inert gas and was heated at a temperature of 220° C. After stabilization, 2 M of Se-DPP (diphenylphosphine) stock solution made by dispersing 1 mmol of selenium in trioctylphosphine (TOP) and 0.05 M of Te-TOP stock solution made by dispersing 0.04 mmol of tellurium in trioctylphosphine were sequentially injected into the reactor. Then the temperature in the reactor was maintained at a temperature of 220° C. for 20 minutes, heated to a temperature of 310° C., and maintained for 1 hour.

2. Synthesis of ZnSe Shell (First Shell)

Then, Zn stock solution in which 1.25 mmol of zinc acetate was dissolved in oleic acid and octadecene and 1.25 M of Se-TOP stock solution made by dispersing 1.25 mmol of selenium in trioctylphosphine were sequentially injected into the reactor. After injection, the reaction was maintained for 30 minutes, and this process was repeated three times.

3. Synthesis of ZnS Shell (Second Shell)

Zn stock solution and 1.25 M of S-TOP stock solution made by dispersing 1.25 mmol of sulfur in trioctylphosphine were sequentially injected to the reactor and maintained for 30 minutes. 2.5 mmol of zinc stearate dissolved in octadecene was injected into the reactor and was maintained at a temperature of 310° C. for 30 minutes. After lowering the temperature to 230° C., 3 mmol of adamantanethiol was injected. After 1 hour, the temperature was lowered to room temperature, and the reaction solution was purified by using hexane and acetone.

Example 2

1. Synthesis of ZnSeTe Core 1.7 mmol of zinc acetate was dissolved in 1.5 ml of oleic acid and 15 ml of octadecene in a reaction flask and heated at a temperature of 100° C. under vacuum. After 1 hour, the atmosphere of the reactor was changed to inert gas and was heated at a temperature of 220° C. After stabilization, 2 M of Se-DPP (diphenylphosphine) stock solution made by dispersing 1 mmol of selenium in trioctylphosphine and 0.05 M of Te-TOP stock solution made by dispersing 0.05 mmol of tellurium in trioctylphosphine were sequentially injected into the reactor. Then the temperature in the reactor was maintained at a temperature of 220° C. for 20 minutes, heated to a temperature of 310° C., and maintained for 1 hour.

2. Synthesis of ZnSe Shell (First Shell)

Zn stock solution in which 1.25 mmol of zinc acetate is dissolved in oleic acid and octadecene and 1.25M of Se-TOP stock solution made by dispersing 1.25 mmol of selenium in trioctylphosphine were sequentially injected into the reactor. After injection, the reaction solution was maintained for 30 minutes, and this process was repeated three times.

3. Synthesis of ZnSeS Shell (Second Shell)

Zn stock solution and SeS-TOP stock solution in which 0.6 mmol of selenium and 0.6 mmol of sulfur are dispersed in trioctylphosphine were injected and maintained for 30 minutes.

3. Synthesis of ZnS Shell (Third Shell)

Zn stock solution and 1.25 M of S-TOP stock solution made by dispersing 1.25 mmol of sulfur in trioctylphosphine were sequentially injected and maintained for 30 minutes. 2.5 mmol of zinc stearate dissolved in octadecene was injected into the reactor and maintained at a temperature of 310° C. for 30 minutes. The temperature was lowered to 230° C. and 3 mmol of adamantanethiol was injected. After 1 hour, the temperature was lowered to room temperature, and the reaction solution was purified by using hexane and acetone.

4. Exchange of Ligand

ZnSeTe/ZnSe/ZnSeS/ZnS quantum dots obtained by purification and 1-adamantanecarboxylic acid were dispersed in toluene at a ratio of 1:1, 1:5, and 1:10 and maintained for 30 minutes. The ratio above is based on mass. At this time, octane thiol, a ligand of the ZnSeTe/ZnSe/ZnSeS/ZnS quantum dots, is exchanged with adamantanecarboxylic acid.

Example 3

Except for using 1-adamantaneacetic acid instead of 1-adamantanecarboxylic acid when exchanging a ligand, the quantum dot was manufactured in substantially the same manner as in Example 2.

Comparative Example 1

1. Synthesis of ZnSeTe Core 1.7 mmol of zinc acetate was dissolved in 1.5 ml of oleic acid and 15 ml of octadecene in a reaction flask and heated at a temperature of 100° C. under vacuum. After 1 hour, the atmosphere of the reactor was changed to inert gas and was heated at a temperature of 220° C. After stabilization, 2 M of Se-DPP (diphenylphosphine) stock solution made by dispersing 1 mmol of selenium in trioctylphosphine and 0.05 M of Te-TOP stock solution made by dispersing 0.04 mmol of tellurium in trioctylphosphine were sequentially injected into the reactor. Then the temperature in the reactor was maintained at a temperature of 220° C. for 20 minutes, and the reaction solution was heated to a temperature of 310° C. and maintained for 1 hour.

2. Synthesis of ZnSe Shell (First Shell)

Zn stock solution in which 1.25 mmol of zinc acetate is dissolved in oleic acid and octadecene and 1.25M of Se-TOP stock solution made by dispersing 1.25 mmol of selenium in trioctylphosphine were sequentially injected into the reactor. After injection, the reaction solution was maintained for 30 minutes, and this process was repeated three times.

3. Synthesis of ZnS Shell (Second Shell)

Zn stock solution and 1.25 M of S-TOP stock solution made by dispersing 1.25 mmol of sulfur in trioctylphosphine were sequentially injected and maintained for 30 minutes. 2.5 mmol of zinc stearate dissolved in octadecene was injected into the reactor and was maintained at a temperature of 310° C. for 30 minutes. After lowering the temperature to 230° C., 4 mmol of 1-dodecanethiol was injected. After 1 hour, the temperature was lowered to room temperature, and the reaction solution was purified by using hexane and acetone.

Comparative Example 2

Except for using 1-octanethiol instead of 1-dodecanethiol in synthesizing ZnS shell, the quantum dot was manufactured in substantially the same manner as in Comparative Example 1.

Evaluation Example 1

After dissolving 5 mg of each quantum dot obtained from Examples 1 to 3 and Comparative Example 2 in hexane, respectively, and dissolving 5 mg of each quantum dot obtained from Example 1 and Comparative Example 2 in toluene and octane, respectively, the solubility of each quantum dot were measured. The results are shown in Table 1 below. O indicates that the solubility is more than 5,000 µg/µl, Δ indicates that the solubility is more than 2,000 µg/µl and less than or equal to 5,000 µg/µl, and X indicates that the solubility is 2,000 µg/µl or less.

TABLE 1

| Quantum dot | Ligand | Hexane | Toluene | Octane |
|---|---|---|---|---|
| Example 1 | 1-adamantanethiol | O | O | O |
| Example 2 | 1-adamantanecarboxylic acid | O | — | — |
| Example 3 | 1-adamantaneacetic acid | O | — | — |
| Comparative Example 2 | 1-octanethiol | Δ | Δ | Δ |

Table 1 shows that the quantum dots according to Examples 1 to 3 have improved solubility characteristics compared to the quantum dot of Comparative Example 2.

Evaluation Example 2

Figure 4:
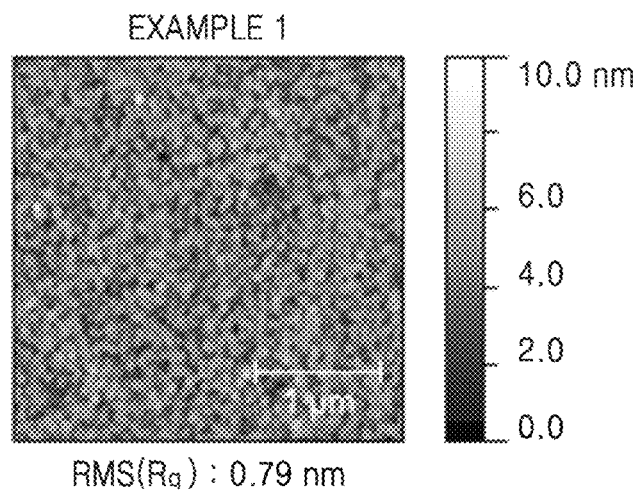
FIG. 4 is an atomic force microscopy (AFM) image of a quantum dot according to Example 1.

Sizes of the quantum dots according to Example 1 and Comparative Example 1 were measured using AFM (Atomic Force Microscopy). FIG. 4 is an AFM image of the quantum dot according to Example 1, and FIG. 5 is an AFM image of the quantum dot according to Comparative Example 1.

Figure 5:
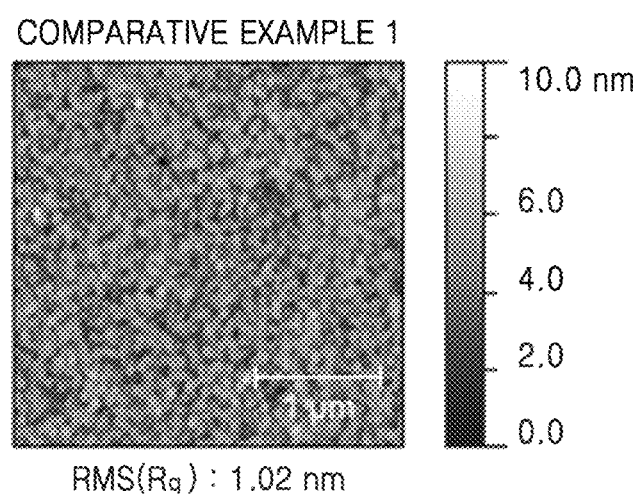
FIG. 5 is an AFM image of a quantum dot according to Comparative Example 1.

Referring to FIGS. 4 and 5, it can be seen that the distance between the quantum dots according to Example 1 is smaller than the distance between quantum dots according to Comparative Example 1.

According to the one or more embodiments, because quantum dots show narrow FWHM and have improved solubility characteristics with respect to solvents, using the quantum dots may result in providing a high quality optical member and electronic apparatus.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and their equivalents.

What is claimed is:

1. A quantum dot comprising:
a nanomaterial; and
a first ligand on a surface of the nanomaterial, wherein the nanomaterial comprises a core and a shell that covers at least a part of the core, and
the first ligand is represented by Formula 1:

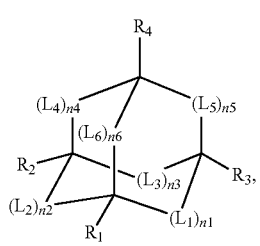

wherein, in Formula 1,
$L_1$ is $N(Z_{1a})$, O, S, or $C(Z_{1a})(Z_{1b})$,
$L_2$ is $N(Z_{2a})$, O, S, or $C(Z_{2a})(Z_{2b})$,
$L_3$ is $N(Z_{3a})$, O, S, or $C(Z_{3a})(Z_{3b})$,
$L_4$ is $N(Z_{4a})$, O, S, or $C(Z_{4a})(Z_{4b})$,
$L_5$ is $N(Z_{5a})$, O, S, or $C(Z_{5a})(Z_{5b})$,
$L_6$ is $N(Z_{6a})$, O, S, or $C(Z_{6a})(Z_{6b})$,
n1 to n6 are each independently an integer from 0 to 10,
$R_1$ to $R_4$, $Z_{1a}$ to $Z_{6a}$, and $Z_{1b}$ to $Z_{6b}$ are each independently selected from: hydrogen, deuterium, —F, —Cl, —Br, —I, a hydroxyl group, a thiol group, a cyano group, a nitro group, an amidino group, a hydrazine group, a hydrazone group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —O($Q_1$), —S($Q_1$), —B($Q_1$)($Q_2$), —C(=O)($Q_1$), —S(=O)$_2$($Q_1$), —P($Q_1$)($Q_2$), and —P(=O)($Q_1$)($Q_2$); and a conjugate base thereof, $R_{10a}$ is:
deuterium, —F, —Cl, —Br, —I, a hydroxyl group, a thio group, a cyano group, a nitro group, an amidino group, a hydrazine group, or a hydrazone group;
a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each unsubstituted or substituted with deuterium, —F, —Cl, —Br, —I, a hydroxyl group, a thio group, a cyano group, a nitro group, an amidino group, a hydrazine group, a hydrazone group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —O($Q_{11}$), —S($Q_{11}$), —B($Q_{11}$)($Q_{12}$), —C(=O)($Q_{11}$), —S(=O)$_2$($Q_{11}$), —P($Q_{11}$)($Q_{12}$), —P(=O)($Q_{11}$)($Q_{12}$), or any combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a thio group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —O($Q_{21}$), —S($Q_{21}$), —B($Q_{21}$)($Q_{22}$), —C(=O)($Q_{21}$), —S(=O)$_2$($Q_{21}$), —P($Q_{21}$)($Q_{22}$), —P(=O)($Q_{21}$)($Q_{22}$), or any combination thereof; or
—Si($Q_{31}$)($Q_{32}$)($Q_{33}$), —N($Q_{31}$)($Q_{32}$), —O($Q_{31}$), —S($Q_{31}$), —B($Q_{31}$)($Q_{32}$), —C(=O)($Q_{31}$), —S(=O)$_2$($Q_{31}$), —P($Q_{31}$)($Q_{32}$), or —P(=O)($Q_{31}$)($Q_{32}$), and wherein $Q_1$ to $Q_3$, $Q_{11}$ to $Q_{13}$, $Q_{21}$ to $Q_{23}$, and $Q_{31}$ to $Q_{33}$ are each independently:
hydrogen; deuterium; —F; —Cl; —Br; —I; a hydroxyl group; a thio group; an amino group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

2. The quantum dot of claim 1, wherein the core comprises a Group II-VI semiconductor compound, a Group III-V semiconductor compound, or any combination thereof.

3. The quantum dot of claim 1, wherein the core comprises ZnS, ZnSe, ZnTe, ZnO, HgS, HgSe, HgTe, GaN, GaP, GaAs, ZnSeS, ZnSeTe, ZnSTe, InP, InAs, InZnP, InGaP, InGaN, or any combination thereof.

4. The quantum dot of claim 1, wherein the shell comprises ZnS, ZnSe, ZnTe, ZnO, ZnSeS, ZnTeS, GaAs, GaP, GaN, Ga$_2$O$_3$, GaSb, HgS, HgSe, HgTe, InAs, InP, InS, InGaP, InSb, InZnP, InZnS, InGaP, InGaN, AlAs, AlP, AlSb, PbS, TiO$_2$, SrSe, or any combination thereof.

5. The quantum dot of claim 1, wherein
$L_1$ is $C(Z_{1a})(Z_{1b})$,
$L_2$ is $C(Z_{2a})(Z_{2b})$,
$L_3$ is $C(Z_{3a})(Z_{3b})$,
$L_4$ is $C(Z_{4a})(Z_{4b})$,
$L_5$ is $C(Z_{5a})(Z_{5b})$,
$L_6$ is $C(Z_{6a})(Z_{6b})$, and
$Z_{1a}$ to $Z_{6a}$ and $Z_{1b}$ to $Z_{6b}$ are each as defined in Formula 1.

6. The quantum dot of claim 1, wherein $R_1$ to $R_4$, $Z_{1a}$ to $Z_{6a}$, and $Z_{1b}$ to $Z_{6b}$ are each independently selected from:
hydrogen, deuterium, —F, —Cl, —Br, —I, a hydroxyl group, a thio group, a $C_1$-$C_{20}$ alkyl group, a $C_1$-$C_{20}$ alkoxy group, and a $C_1$-$C_{20}$ alkylthio group;
a $C_1$-$C_{20}$ alkyl group, a $C_1$-$C_{20}$ alkoxy group, and a $C_1$-$C_{20}$ alkylthio group, each substituted with at least one selected from deuterium, —F, —Cl, —Br, —I, —CD$_3$, —CD$_2$H, —CDH$_2$, —CF$_3$, —CF$_2$H, —CFH$_2$, a $C_1$-$C_{10}$ alkyl group, a cyclopentyl group, a cyclohexyl group, a cycloheptyl group, a cyclooctyl group, —N(Q$_{31}$)(Q$_{32}$), —O(Q$_{31}$), —S(Q$_{31}$), —P(Q$_{31}$)(Q$_{32}$), —C(=O)(Q$_{31}$), —S(=O)$_2$(Q$_{31}$), and —P(=O)(Q$_{31}$)(Q$_{32}$);
a cyclopentyl group, a cyclohexyl group, a cycloheptyl group, a cyclooctyl group, a phenyl group, a biphenyl group, a $C_1$-$C_{10}$ alkylphenyl group, and a naphthyl group, each unsubstituted or substituted with at least one selected from deuterium, —F, —Cl, —Br, —I, —CD$_3$, —CD$_2$H, —CDH$_2$, —CF$_3$, —CF$_2$H, —CFH$_2$, a $C_1$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, —N(Q$_{31}$)(Q$_{32}$), —O(Q$_{31}$), —S(Q$_{31}$), —P(Q$_{31}$)(Q$_{32}$), —C(=O)(Q$_{31}$), —S(=O)$_2$(Q$_{31}$), and —P(=O)(Q$_{31}$)(Q$_{32}$);
—N(Q$_1$)(Q$_2$), —O(Q$_1$), —S(Q$_1$), —C(=O)(Q$_1$), —S(=O)$_2$(Q$_1$), —P(Q$_1$)(Q$_2$), and —P(=O)(Q$_1$)(Q$_2$); and
a conjugate base thereof, and
wherein $Q_1$, $Q_2$, $Q_{31}$, and $Q_{32}$ are each independently selected from:
hydrogen, deuterium, —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$; and
—F, —Cl, —Br, —I, a hydroxyl group, a thio group, an amino group, and a $C_1$-$C_{10}$ alkyl group.

7. The quantum dot of claim 1, wherein $R_1$ to $R_4$ are each independently selected from:
hydrogen, deuterium, —F, —Cl, —Br, —I, a hydroxyl group, a thio group, and a $C_1$-$C_{20}$ alkylthio group;
a $C_1$-$C_{20}$ alkyl group, a $C_1$-$C_{20}$ alkoxy group, and a $C_1$-$C_{20}$ alkylthio group, each substituted with at least one selected from deuterium, —F, —Cl, —Br, —I, —CD$_3$, —CD$_2$H, —CDH$_2$, —CF$_3$, —CF$_2$H, —CFH$_2$, a $C_1$-$C_{10}$ alkyl group, —N(Q$_{31}$)(Q$_{32}$), —O(Q$_{31}$), —S(Q$_{31}$), —P(Q$_{31}$)(Q$_{32}$), and —C(=O)(Q$_{31}$);
—N(Q$_1$)(Q$_2$), —C(=O)(Q$_1$), and —P(Q$_1$)(Q$_2$); and
a conjugate base thereof, and
wherein $R_{10a}$, $Q_1$, $Q_2$, $Q_{31}$, and $Q_{32}$ are as defined in Formula 1.

8. The quantum dot of claim 1, wherein the first ligand is selected from among 1-adamantanecarboxylic acid, 1-adamantaneacetic acid, 1-adamantanemethanol, 1-fluoroadamantane, 1-iodoadamantane, 1-bromoadamantane, 1-chloroadamantane, 1-methyladamantane, adamantan-1-amine, adamantane-1-thiol, adamantane-2-thiol, 1-adamantylmethanethiol, 2-(1-adamantyl) ethanethiol, 6-(1-adamantyl) hexane-1-thiol, 18-(1-adamantyl) octadecane-1-thiol, 1-adamantanemethylamine, o-(1-adamantyl) hydroxylamine, 1-adamantylphosphane, adamantane-1-carbaldehyde, 1-hydroperoxyadmantane, 1-adamantanecarbonylchloride, 1,3-dibromoadamantane, 1 adamantyl thiohypochlorite, 1-(disulfanyl) adamantine, 1-ethylsulfanyladamantane, adamantane-1,3-dithiol, 1-(dichloromethyl) adamantine, and 1-(chloromethyl) adamantine.

9. The quantum dot of claim 1, wherein a maximum emission wavelength of a photoluminescence spectrum of the nanomaterial is 420 nm to 480 nm.

10. The quantum dot of claim 1, wherein a full width at half maximum (FWHM) of a photoluminescence spectrum of the nanomaterial is 40 nm or less.

11. A method of manufacturing a quantum dot, wherein the quantum dot comprises:
a nanomaterial; and
a first ligand located on a surface of the nanomaterial, wherein
the nanomaterial comprises a core and a shell that covers at least a part of the core, and
the first ligand comprises a condensed polycyclic group in which two or more rings are condensed,
the method comprising:
mixing a precursor of the nanomaterial with a precursor of the first ligand; or
exchanging a second ligand of the nanomaterial including the second ligand with the first ligand,
wherein the second ligand is different from the first ligand, and
wherein the precursor of the first ligand and the first ligand are represented by Formula 1:

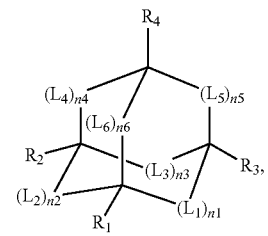

Formula 1 wherein, in Formula 1,
$L_1$ is $N(Z_{1a})$, O, S, or $C(Z_{1a})(Z_{1b})$,
$L_2$ is $N(Z_{2a})$, O, S, or $C(Z_{2a})(Z_{2b})$,
$L_3$ is $N(Z_{3a})$, O, S, or $C(Z_{3a})(Z_{3b})$,
$L_4$ is $N(Z_{4a})$, O, S, or $C(Z_{4a})(Z_{4b})$,
$L_5$ is $N(Z_{5a})$, O, S, or $C(Z_{5a})(Z_{5b})$,
$L_6$ is $N(Z_{6a})$, O, S, or $C(Z_{6a})(Z_{6b})$,
n1 to n6 are each independently an integer from 0 to 10,
$R_1$ to $R_4$, $Z_{1a}$ to $Z_{6a}$, and $Z_{1b}$ to $Z_{6b}$ are each independently selected from: hydrogen, deuterium, —F, —Cl, —Br, —I, a hydroxyl group, a thiol group, a cyano group, a nitro group, an amidino group, a hydrazine group, a hydrazone group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —O($Q_1$), —S($Q_1$), —B($Q_1$)($Q_2$), —C(=O)($Q_1$), —S(=O)$_2$($Q_1$), —P($Q_1$)($Q_2$), and —P(=O)($Q_1$)($Q_2$); and a conjugate base thereof, $R_{10a}$ is:

deuterium, —F, —Cl, —Br, —I, a hydroxyl group, a thio group, a cyano group, a nitro group, an amidino group, a hydrazine group, or a hydrazone group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each unsubstituted or substituted with deuterium, —F, —Cl, —Br, —I, a hydroxyl group, a thio group, a cyano group, a nitro group, an amidino group, a hydrazine group, a hydrazone group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —O($Q_{11}$), —S($Q_{11}$), —B($Q_{11}$)($Q_{12}$), —C(=O)($Q_{11}$), —S(=O)$_2$($Q_{11}$), —P($Q_{11}$)($Q_{12}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a thio group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —O($Q_{21}$), —S($Q_{21}$), —B($Q_{21}$)($Q_{22}$), —C(=O)($Q_{21}$), —S(=O)$_2$($Q_{21}$), —P($Q_{21}$)($Q_{22}$), —P(=O)($Q_{21}$)($Q_{22}$), or any combination thereof; or —Si($Q_{31}$)($Q_{32}$)($Q_{33}$), —N($Q_{31}$)($Q_{32}$), —O($Q_{31}$), —S($Q_{31}$), —B($Q_{31}$)($Q_{32}$), —C(=O)($Q_{31}$), —S(=O)$_2$($Q_{31}$), —P($Q_{31}$)($Q_{32}$), or —P(=O)($Q_{31}$)($Q_{32}$), and wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a thio group; an amino group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

12. The method of claim 11, wherein the precursor of the nanomaterial comprises Zn, Hg, Ga, In, or any combination thereof.

13. A quantum dot comprising:

a nanomaterial; and a first ligand on a surface of the nanomaterial, wherein the nanomaterial comprises a core and a shell that covers at least a part of the core, and the first ligand is represented by Formula 1:

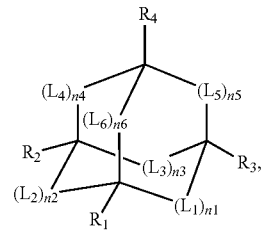

Formula 1 wherein, in Formula 1, $L_1$ is N($Z_{1a}$), O, S, or C($Z_{1a}$)($Z_{1b}$),
$L_2$ is N($Z_{2a}$), O, S, or C($Z_{2a}$)($Z_{2b}$),
$L_3$ is N($Z_{3a}$), O, S, or C($Z_{3a}$)($Z_{3b}$),
$L_4$ is N($Z_{4a}$), O, S, or C($Z_{4a}$)($Z_{4b}$),
$L_5$ is N($Z_{5a}$), O, S, or C($Z_{5a}$)($Z_{5b}$),
$L_6$ is N($Z_{6a}$), O, S, or C($Z_{6a}$)($Z_{6b}$), n1 to n6 are each independently an integer from 0 to 10, $R_1$ to $R_4$, $Z_{1a}$ to $Z_{6a}$, and $Z_{1b}$ to $Z_{6b}$ are each independently selected from: hydrogen, deuterium, —F, —Cl, —Br, —I, a hydroxyl group, a thiol group, a cyano group, a nitro group, an amidino group, a hydrazine group, a hydrazone group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —O($Q_1$), —S($Q_1$), —B($Q_1$)($Q_2$), —C(=O)($Q_1$), —S(=O)$_2$($Q_1$), —P($Q_1$)($Q_2$), and —P(=O)($Q_1$)($Q_2$); and a conjugate base thereof, $R_{10a}$ is:

deuterium, —F, —Cl, —Br, —I, a hydroxyl group, a thio group, a cyano group, a nitro group, an amidino group, a hydrazine group, or a hydrazone group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each unsubstituted or substituted with deuterium, —F, —Cl, —Br, —I, a hydroxyl group, a thio group, a cyano group, a nitro group, an amidino group, a hydrazine group, a hydrazone group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —O($Q_{11}$), —S($Q_{11}$), —B($Q_{11}$)($Q_{12}$), —C(=O)($Q_{11}$), —S(=O)$_2$($Q_{11}$), —P($Q_{11}$)($Q_{12}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a thio group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{21})(Q_{22})(Q_{23})$, —N$(Q_{21})(Q_{22})$, —O$(Q_{21})$, —S$(Q_{21})$, —B$(Q_{21})(Q_{22})$, —C(=O)$(Q_{21})$, —S(=O)$_2$$(Q_{21})$, —P$(Q_{21})(Q_{22})$, —P(=O)$(Q_{21})(Q_{22})$, or any combination thereof; or —Si$(Q_{31})(Q_{32})(Q_{33})$, —N$(Q_{31})(Q_{32})$, —O$(Q_{31})$, —S$(Q_{31})$, —B$(Q_{31})(Q_{32})$, —C(=O)$(Q_{31})$, —S(=O)$_2$$(Q_{31})$, —P$(Q_{31})(Q_{32})$, or —P(=O)$(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ are each independently:

hydrogen; deuterium; —F; —Cl; —Br; —I; a hydroxyl group; a thio group; an amino group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, wherein at least one selected from $R_1$ to $R_4$ is selected from: —F, —Cl, —Br, —I, a hydroxy group or a conjugate base thereof (—O$^-$), a thio group or a conjugate base thereof (—S$^-$), an amino group or a conjugate base thereof (—NH$^-$), a carboxylic acid group or a conjugate base thereof (—COO$^-$), and an acetic acid group or a conjugate base thereof (—CH$_2$COO$^-$); and a $C_1$-$C_{20}$ alkyl group unsubstituted or substituted with at least one selected from deuterium, —F, —Cl, —Br, —I, a hydroxy group or a conjugate base thereof (—O$^-$), a thio group or a conjugate base thereof (—S$^-$), an amino group or a conjugate base thereof (—NH$^-$), a carboxylic acid group or a conjugate base thereof (—COO$^-$), and an acetic acid group or a conjugate base thereof (—CH$_2$COO$^-$).

14. A composition comprising the quantum dot of claim 1 and a solvent.

15. An optical member comprising the quantum dot of claim 1.

16. An electronic apparatus comprising the quantum dot of claim 1.

17. The electronic apparatus of claim 16, further comprising:

a light source; and a color conversion member on a path of light emitted from the light source, wherein the quantum dot is in the color conversion member.

18. The electronic apparatus of claim 16, further comprising:

a light-emitting device comprising: a first electrode; a second electrode facing the first electrode; and an emission layer between the first electrode and the second electrode, wherein the quantum dot is in the light-emitting device.

* * * * *